US008637225B2

(12) United States Patent
Arai et al.

(10) Patent No.: US 8,637,225 B2
(45) Date of Patent: Jan. 28, 2014

(54) MAGNETIC RECORDING MEDIUM AND MAGNETIC RECORDING/REPRODUCING APPARATUS

(75) Inventors: Yoshikazu Arai, Ichihara (JP); Hiroshi Uchida, Oita (JP); Naoyuki Imai, Ichihara (JP); Masato Fukushima, Chiba (JP)

(73) Assignee: Showa Denko K.K., Tokyo (JP)

( * ) Notice: Subject to any disclaimer, the term of this patent is extended or adjusted under 35 U.S.C. 154(b) by 503 days.

(21) Appl. No.: 12/933,348

(22) PCT Filed: Mar. 10, 2009

(86) PCT No.: PCT/JP2009/054537
§ 371 (c)(1),
(2), (4) Date: Sep. 17, 2010

(87) PCT Pub. No.: WO2009/116431
PCT Pub. Date: Sep. 24, 2009

(65) Prior Publication Data
US 2011/0019307 A1    Jan. 27, 2011

(30) Foreign Application Priority Data

Mar. 18, 2008 (JP) .................................. 2008-070016
Aug. 21, 2008 (JP) .................................. 2008-212911

(51) Int. Cl.
*G11B 5/84*     (2006.01)
*G11B 5/855*    (2006.01)

(52) U.S. Cl.
USPC ........... 430/320; 430/314; 430/323; 430/342; 430/331

(58) Field of Classification Search
None
See application file for complete search history.

(56) References Cited

U.S. PATENT DOCUMENTS

| 5,037,861 | A | * | 8/1991 | Crivello et al. ............... 522/172 |
| 5,861,235 | A | | 1/1999 | Harkness et al. |
| 5,907,448 | A | | 5/1999 | Watanabe et al. |
| 6,014,296 | A | | 1/2000 | Ichihara et al. |
| 2004/0070877 | A1 | * | 4/2004 | Miller et al. .................. 360/126 |
| 2006/0222897 | A1 | * | 10/2006 | Kamata et al. ................ 428/826 |
| 2006/0280861 | A1 | * | 12/2006 | Shirotori et al. .............. 427/127 |

(Continued)

FOREIGN PATENT DOCUMENTS

| JP | 06-259709 A | 9/1994 |
| JP | 09-097419 A | 4/1997 |

(Continued)

OTHER PUBLICATIONS

Toasosei Co. Ltd., "SQ series, Silsesquioxane derivatives, technical information",10 pages (Oct. 3, 2005).*

(Continued)

*Primary Examiner* — Martin Angebranndt
(74) *Attorney, Agent, or Firm* — Sughrue Mion, PLLC

(57) ABSTRACT

A method for producing a magnetic recording medium comprising at least a recording layer and a protective film provided on top of a non-magnetic substrate, the method comprising, in the following order, forming a continuous recording layer on the substrate, forming a patterned resist layer, partially removing the recording layer based on a resist pattern, applying an organosilicon compound having an active energy beam-curable functional group onto the recording layer and regions from which the recording layer has been removed, curing the organosilicon compound with an active energy beam, etching the organosilicon compound to expose a magnetic layer, and forming a protective film.

18 Claims, 2 Drawing Sheets

(56) References Cited

U.S. PATENT DOCUMENTS

| | | | |
|---|---|---|---|
| 2007/0031706 A1 | 2/2007 | Okawa et al. | |
| 2009/0029298 A1* | 1/2009 | Lee et al. | 430/327 |
| 2009/0121175 A1* | 5/2009 | Maeda et al. | 252/62.51 R |
| 2009/0263631 A1 | 10/2009 | Sakamoto et al. | |
| 2010/0015471 A1* | 1/2010 | Jayashankar | 428/800 |
| 2010/0118441 A1* | 5/2010 | Ishibashi et al. | 360/135 |
| 2011/0014499 A1* | 1/2011 | Uchida et al. | 428/846 |
| 2011/0070462 A1* | 3/2011 | Uchida et al. | 428/800 |
| 2011/0261479 A1* | 10/2011 | Takahashi et al. | 360/55 |

FOREIGN PATENT DOCUMENTS

| | | | |
|---|---|---|---|
| JP | 10-083080 A | | 3/1998 |
| JP | 2003-100609 A | | 4/2003 |
| JP | 2005-008765 A | | 1/2005 |
| JP | 2005-100496 A | | 4/2005 |
| JP | 2007-072374 A | | 3/2007 |
| JP | 2007-091935 A | | 4/2007 |
| JP | 2007-129045 | * | 5/2007 |
| JP | 2008-243319 | * | 10/2008 |
| WO | 2008/087741 | * | 7/2008 |

OTHER PUBLICATIONS

Schmid et al. "Implementation of an imprint damascene process of interconnect fabrication", J Vac. Sci. Technol. B. vol. 24(3) pp. 1283-1291 (2006).*

Zhang et al. "Hydrosilylation of allyl alcohol with [HSiMe2OSiO1.5]8 : octa(3-hydroxypropyldimethylsiloxy)octasilsesquioxane and its octamethacrylate derivatives as potential precursors to hybrid nanocomposites", JACS vol. 122(29) pp. 6979-6988 (2000).*

Crivello et al. The synthesis, charachterization and photoinitiatoed cationic polymerization of silicon containing epoxy resins., J. Poly Sci.:Pt A, Poly. Chem., vol. 28 pp. 479-503 (1990).*

Choi et al., "Organic/inorganic hybrid composites form cubic silsesquioxanes", JACS, vol. 123(46) pp. 11420-11430 (2001).*

E. Voss, et al., "New Synthetic Route to the Hydridospherosiloxanes $O_h$-$H_8Si_8O_{12}$ and $D_{5h}$-$H_{10}Si_{10}O_{15}$," Inorg. Chem, 1991, pp. 2707-2708, vol. 30.

I. Hasegawa, et al., "Dimethylvinylsilylation of $Si_8O_{20}^{8-}$silicate anion in methanol solutions of tetramethylammonium silicate," J. Organometallic Chem., 1992, pp. 373-380, vol. 441.

* cited by examiner

MAGNETIC RECORDING MEDIUM AND MAGNETIC RECORDING/REPRODUCING APPARATUS

TECHNICAL FIELD

The present invention relates to a magnetic recording medium used in a hard disk apparatus or the like, a method for producing the magnetic recording medium, and a magnetic recording/reproducing apparatus equipped with the magnetic recording medium.

Priority is claimed on Japanese Patent Application No. 2008-070016, filed Mar. 18, 2008, and Japanese Patent Application No. 2008-212911, filed Aug. 21, 2008, the contents of which are incorporated herein by reference.

BACKGROUND ART

In recent years, the range of applications for magnetic recording apparatus such as magnetic disk devices, floppy (a registered trademark) disk devices and magnetic tape devices has expanded enormously, and not only has the importance of such devices increased, but the recording density of the magnetic recording media used in these devices has also continued to increase markedly.

Since the introduction of MR heads (Magnetoresistive heads) and PRML (Partial Response Maximum Likelihood) techniques, the increase in surface recording densities has become even more dramatic, and the more recent introduction of GMR heads (Giant Magnetoresistive heads) and TMR heads (Tunnel Magnetoresistive heads) and the like has meant that recording densities continue to increase at a pace of approximately 100% per year.

There are still strong demands for even higher recording densities for these magnetic recording media, and in order to satisfy these demands, higher coercive force and higher signal to noise ratio (SN ratio) of the magnetic recording layer and higher levels of resolution are requested. Further, in recent years, the absolute film thickness of the medium has been reduced in order to attain higher surface recording density, but this has lead to a problem wherein this reduced thickness is accompanied by a phenomenon in which the recording magnetization is weakened by thermal disturbances, and the thermal stability of the recording is becoming a significant technical issue. In particular, attempts to improve the aforementioned SN ratio have frequently resulted in a deterioration in the thermal stability, and combining a high SN ratio with superior thermal stability has become a particular target of current research and development. Generally, in a medium having an excellent SN ratio, the crystal grain size of the magnetic grains that constitute the magnetic layer is usually very small, and although this small grain size is effective in terms of suppressing medium noise, it means that the thermal stability of the magnetization is close to the unstable region.

Furthermore, in recent years, concurrently with the improvements in linear recording density, efforts are also continuing into raising the surface recording density by increasing the track density, and in the most recent magnetic recording apparatus, the track density has reached 110 kTPI. However, as the track density is increased, mutual interference tends to occur between the magnetically recorded information within adjacent tracks, and the resulting magnetized transition region in the boundary region between the tracks acts as a noise source, easily causing problems such as a deterioration in the SN ratio. This leads directly to a reduction in the bit error rate, and is therefore an impediment to achieving increased recording densities.

Further, because the distance between tracks narrows, the magnetic recording apparatus requires extremely high-precision track servo technology, and a method is usually employed where recording is executed over a comparatively wide range, and reproduction is then executed across a narrower range that that used during recording in order to exclude, as far as possible, effects from adjacent tracks. Although this method enables inter-track effects to be suppressed to a minimum, achieving a satisfactory reproduction output level can be difficult, and therefore ensuring an adequate SN ratio is also difficult. In recent years, perpendicular magnetic recording media have been used to ensure satisfactory thermal stability for the above types of media.

In this manner, perpendicular magnetic recording media are used as a technology to achieve higher recording density, but in order to achieve even further high recording density in perpendicular magnetic recording, the track density must be increased. Furthermore, "fringing" of the recording edge portions, which tends to become problematic in perpendicular magnetic recording media as the track density is increased, must be reduced.

One example of a method of avoiding this fringing is a discrete track medium (for example, see Patent Documents 1 and 2 listed below).

Patent Document 1 proposes a structure for a discrete medium in which the data regions are formed as convex portions and guard bands are formed as concave portions. However, providing these concave-type guard bands results in the formation of concave-convex portions on the disk surface, which tends to have an undesirable effect on the floating properties of the magnetic recording head and therefore it is not preferable.

Patent Document 2 proposes a discrete medium with a flat disk surface in which guard bands are filled with an embedding material. Examples for this guard band member include oxides, nitrides, carbides, borides, and polymer compounds.

An example of the method used for embedding an oxide or the like in the guard bands of a discrete medium is a method in which a sputtering method or the like is used to deposit a film of an oxide or the like on both the guard bands and the data regions of the discrete medium, and the surface of that film is then etched by ion beam etching or the like to re-expose the data regions of the discrete medium, thereby forming data regions that are patterned by the guard bands on the surface of the discrete medium. A protective film is then formed on top of the object to complete formation of the discrete medium.

Furthermore, Patent Document 3 discloses the use of a photocurable resin having fluidity during the formation of the guard bands (non-magnetic regions) of a discrete medium.

Patent Document 4 discloses the use of a siloxane-based polymer compound with a weight average molecular weight of not less than 1,000 and not more than 50,000 which has the function of causing a photocuring reaction for nanoimprinting. Further, Patent Document 5 discloses a method of forming a very fine $SiO_2$ pattern on a substrate surface by applying a mixture of a hydrogenated silsesquioxane polymer and a solvent to the substrate surface, embossing a very fine pattern into the coated surface, and then removing the solvent and performing hydrolysis curing.

[Patent Document 1]
Japanese Unexamined Patent Application, First Publication No. Hei 6-259709

[Patent Document 2]
Japanese Unexamined Patent Application, First Publication No. Hei 9-97419

[Patent Document 3]
Japanese Unexamined Patent Application, First Publication No. 2005-100496
[Patent Document 4]
Japanese Unexamined Patent Application, First Publication No. 2007-072374
[Patent Document 5]
Japanese Unexamined Patent Application, First Publication No. 2003-100609

DISCLOSURE OF INVENTION

Problems to be Solved by the Invention

In those cases where the types of oxides, nitrides, carbides, borides and polymer compounds disclosed in Patent Document 2 are used for the guard band members of a discrete medium, the surface following etching tends to be rough, and even if a protective film is formed on top of the surface, a discrete medium with poor surface roughness may result.

Further, when a discrete medium is produced using the types of oxides, nitrides, carbides, borides and polymer compounds disclosed in Patent Document 2 as the guard band members, and the resulting medium is then installed within a hard disk drive, then depending on the hard disk drive usage environment, corrosion may occur within the magnetic recording medium, resulting in failure of the hard disk drive, and moreover, the electromagnetic conversion properties of the magnetic recording medium tend to deteriorate.

The inventors of the present invention undertook extensive analysis and investigation of the reasons for the occurrence of the types of problems outlined above, and discovered that in those cases where, during the production of a discrete medium, poor coating properties and etching properties of the material used for the guard band members resulted in the generation of unevenness on the surface of the guard band members following etching, then even when a protective film was formed on the surface, this underlying unevenness was inherited by the protective film, resulting in the production of a discrete medium with poor surface roughness. Further, it became clear that when the guard band members were formed by a sputtering method, the non-magnetic material was unable to completely and precisely fill the concave portions of the magnetic layer, meaning voids tended to develop therein, and that depending on the usage environment for the hard disk drive, corrosion could then develop starting within these voids.

One possible method for preventing the formation of these types of voids is a method in which the guard bands are formed by curing a liquid material. Examples of known liquid materials for forming the guard bands include silicon oxide compounds such as spin-on glass, but these materials tend to have a high viscosity, meaning completely and precisely filling the concave portions of the magnetic layer is difficult. Although low-viscosity spin-on glass materials and the like are known, these materials exhibit a large shrinkage ratio upon curing, and it became apparent that this shrinkage tended to cause voids within the concave portions of the magnetic layer and cause distortions within the convex portions of the magnetic layer, with these voids and distortions then acting as the origins for corrosion of the magnetic recording medium.

The present invention has an object of producing a discrete medium or patterned medium for magnetic recording that is capable of achieving a high recording density, wherein the medium surface exhibits superior smoothness, and the medium exhibits excellent environment resistance and can be produced with a high level of productivity.

Means to Solve the Problems

As a result of intensive effort and research to solve the above-mentioned problems, the inventors of the present invention discovered that during production of a magnetic recording medium having at least a recording layer that is magnetically divided by a non-magnetic material, and a protective film, formed on a non-magnetic substrate, by using a an organosilicon compound that is curable by irradiation with an active energy beam as the non-magnetic material, not only could a magnetic recording medium with superior surface smoothness be provided, but that magnetic recording medium also exhibited excellent environment resistance, and they were therefore able to complete the present invention.

This invention is based on the finding that the organosilicon compound used in the production of the present invention not only exhibits superior wetting properties relative to the materials that constitute the magnetic layer and the like of the magnetic recording medium, but also itself exhibits low levels of surface tension and viscosity, meaning the compound is able to completely and precisely fill the concave portions of the recording layer, and the finding that the organosilicon compound exhibits a very low shrinkage ratio upon curing, meaning the compound imparts minimal distortion to the ultra fine structure of the recording layer, and forms a smooth surface upon solidifying.

Furthermore, the organosilicon compound used in the production of the present invention has a skeleton for which the structure is highly controlled, and therefore exhibits excellent etching properties relative to dry etching using an ion beam or the like, and yields smooth etched surfaces.

The present invention, which is based on these findings, adopts the aspects described below.

(1) A method for producing a magnetic recording medium comprising at least a recording layer and a protective film provided on top of a non-magnetic substrate, the method comprising, in the following order, forming a continuous recording layer on the substrate, forming a patterned resist layer, partially removing the recording layer based on a resist pattern, applying an organosilicon compound having an active energy beam-curable functional group onto the recording layer and regions from which the recording layer has been removed, curing the organosilicon compound with an active energy beam, etching the organosilicon compound to expose a magnetic layer, and forming a protective film.

(2) The method for producing a magnetic recording medium according to (1) above, wherein the active energy beam-curable functional group is one or more groups selected from the group consisting of an epoxy group, oxetanyl group, and (meth)acryloyl group.

(3) The method for producing a magnetic recording medium according to (1) or (2) above, wherein the organosilicon compound having an active energy beam-curable functional group comprises a compound represented by chemical formula 1 shown below:

[Chemical formula 1]

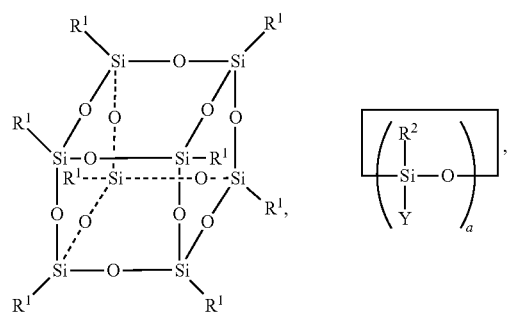

-continued

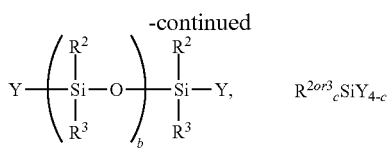

wherein $R^1$ represents Y or $YR^2R^3SiO—$, $R^2$ and $R^3$ each represents an aliphatic group of 1 to 10 carbon atoms or an aromatic hydrocarbon group, a represents 4 or 5, b represents 1 or 2, c represents an integer of 1 to 3, and Y is shown below in chemical formula 2:

[Chemical formula 2]

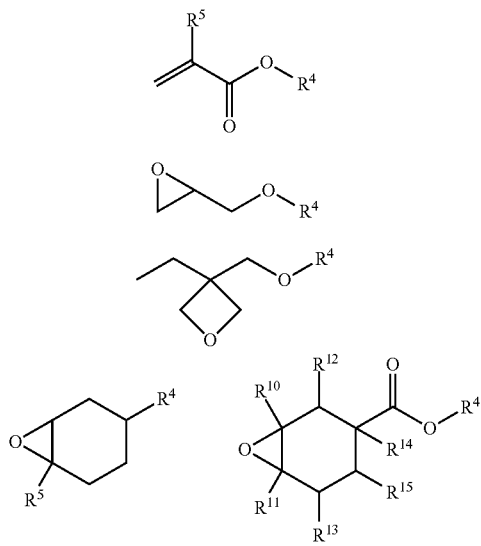

wherein $R^4$ represents one structure shown below in chemical formula 3, $R^5$ represents a hydrogen atom or a methyl group, each of $R^{10}$ to $R^{14}$ represents a hydrogen atom, an alkyl group of 1 to 6 carbon atoms, or a trialkylsilyl group of 1 to 4 carbon atoms, and $R^{15}$ represents a hydrogen atom, an alkyl group of 1 to 6 carbon atoms, a trialkylsilyl group of 1 to 4 carbon atoms, or an aryl group,

[Chemical formula 3]

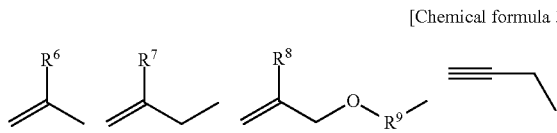

wherein each of $R^6$ to $R^8$ represents a hydrogen atom or a methyl group, and $R^9$ represents an alkylene group of 2 to 8 carbon atoms.

(4) The method for producing a magnetic recording medium according to any one of (1) to (3) above, wherein a viscosity of the organosilicon compound during application is within a range from 10 mPa·s to 1,000,000 mPa·s at 25° C., and a concave-convex pattern formed on a surface to which the organosilicon compound is applied comprises concave portion having a minimum width of 100 nm or less and a maximum depth of 20 nm or more.

(5) The method for producing a magnetic recording medium according to any one of (1) to (4) above, wherein the organosilicon compound comprises a silsesquioxane skeleton-containing compound having a silsesquioxane skeleton represented by formula (1) shown below within a molecule.

[Chemical formula 4]

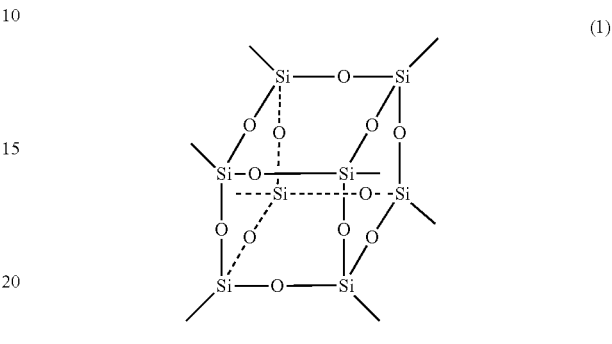

(6) The method for producing a magnetic recording medium according to (5) above, wherein the silsesquioxane skeleton represents at least 5% of a molecular weight of the silsesquioxane skeleton-containing compound.

(7) The method for producing a magnetic recording medium according to any one of (4) to (6) above, wherein the silsesquioxane skeleton-containing compound is produced by performing a hydrosilylation reaction between a cage-type silsesquioxane (A) having Si—H groups and the silsesquioxane skeleton, and a compound (B) containing the curable functional group and a carbon-carbon unsaturated bond other than the curable functional group.

(8) The method for producing a magnetic recording medium according to any one of (5) to (7) above, wherein the cage-type silsesquioxane (A) is represented by formula (2) shown below:

[Chemical formula 5]

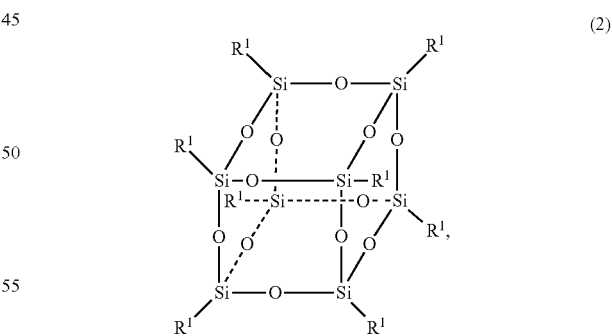

wherein $R^1$ represents a hydrogen atom or $HR^2R^3SiO—$, and $R^2$ and $R^3$ each represents an aliphatic group of 1 to 10 carbon atoms or an aromatic hydrocarbon group.

(9) The method for producing a magnetic recording medium according to (7) or (8) above, wherein the compound (B) is at least one selected from the group consisting of a compound (a), a compound (b) and a compound (c) shown below in chemical formula 6:

[Chemical formula 6]

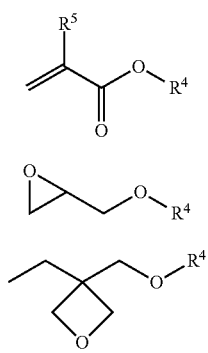

wherein R⁴ represents one structure shown below in chemical formula 7, and R⁵ represents a hydrogen atom or a methyl group,

[Chemical formula 7]

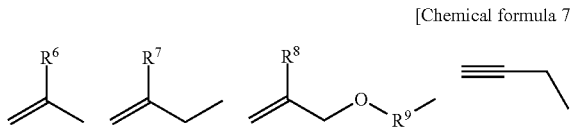

wherein each of R⁶ to R⁸ represents a hydrogen atom or a methyl group, and R⁹ represents an alkylene group of 2 to 8 carbon atoms.

(10) The method for producing a magnetic recording medium according to any one of (5) to (9) above, wherein the organosilicon compound further comprises a curing agent.

(11) The method for producing a magnetic recording medium according to (10) above, wherein the active energy beam-curable functional group is an epoxy group, and the curing agent is an acid anhydride.

(12) The method for producing a magnetic recording medium according to (10) or (11) above, wherein the organosilicon compound further comprises a polythiol compound, and the active energy beam-curable functional group is a (meth)acryloyl group.

(13) The method for producing a magnetic recording medium according to (10) or (11) above, wherein the organosilicon compound further comprises a compound having a vinyl ether group, and the active energy beam-curable functional group the curable functional group is an epoxy group.

(14) The method for producing a magnetic recording medium according to any one of (1) to (13) above, wherein spin coating or a dipping method is used for applying the organosilicon compound having an active energy beam-curable functional group.

(15) The method for producing a magnetic recording medium according to any one of (1) to (14) above, wherein etching of the organosilicon compound is performed using an ion beam etching method.

(16) A magnetic recording medium comprising at least a recording layer that is magnetically divided by a non-magnetic material, and a protective film, formed on a non-magnetic substrate, wherein the non-magnetic material is an organosilicon compound that has been cured with an active energy beam.

(17) A magnetic recording/reproducing apparatus comprising a magnetic recording medium and a magnetic head for recording and reproducing information on the magnetic recording medium, wherein the magnetic recording medium is a magnetic recording medium according to (16) above.

Effect of the Invention

The magnetic recording medium of the present invention uses a liquid organosilicon compound having an active energy beam-curable functional group to form non-magnetic regions around the periphery of a magnetic recording pattern. This compound has a large molecular weight and yet exhibits low viscosity, and suffers minimal shrinkage upon curing with an active energy beam. Further, the compound also exhibits favorable etching properties upon ion milling or the like, yielding a smooth etched surface. Accordingly, when this compound is used in the production of a magnetic recording medium having a recording layer that is magnetically divided by a non-magnetic material, no voids are generated within the boundary regions between the magnetic recording pattern portions and the surrounding non-magnetic material portions, the compound causes no distortions to the ultra fine shapes of the magnetic recording pattern portions, and a magnetic recording medium with superior smoothness can be produced.

Moreover, because a magnetic recording medium produced using this method has a smooth surface, the space between the magnetic layer and the magnetic recording/reproducing head can be reduced, the medium is compatible with higher recording densities, and even when the magnetic recording medium is used under conditions of high temperature and high humidity, no corrosion of the magnetic recording medium occurs, meaning a hard disk drive with excellent environment resistance can be provided.

BRIEF DESCRIPTION OF THE DRAWINGS

FIG. 1 illustrates a method for producing a magnetic recording medium according to the present invention, wherein FIG. 1(A) is a cross-sectional view illustrating a state following formation of a recording layer on a substrate, FIG. 1(B) is a cross-sectional view illustrating a state following formation of a resist, FIG. 1(C) is a cross-sectional view illustrating a state following imprinting with a stamper, FIG. 1(D) is a cross-sectional view illustrating a state following removal of each portion by etching, FIG. 1(E) is a cross-sectional view illustrating a state following formation of a deposition layer, FIG. 1(F) is a cross-sectional view illustrating a state following smoothing of the surface, FIG. 1(G) is a cross-sectional view illustrating a state following formation of a protective film, and FIG. 1(H) is a cross-sectional view illustrating a state following formation of a lubricant layer.

DESCRIPTION OF THE REFERENCE SYMBOLS

Figure 1:
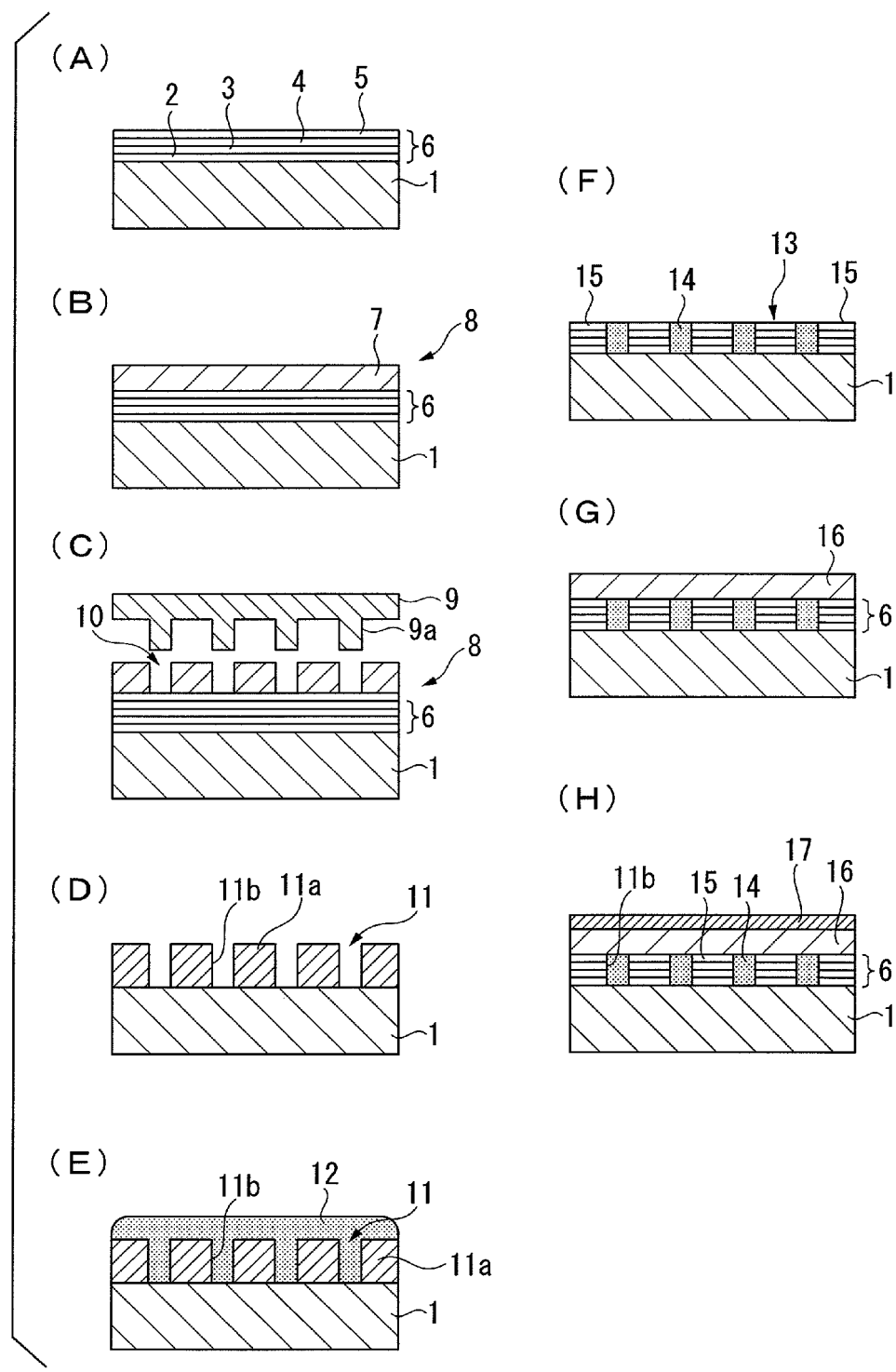

1 Non-magnetic substrate
2 Soft magnetic backing layer
3 Orientation control layer
4 Oxide granular layer
5 Protective film
6 Recording layer
7 Resist
8 Medium
9 Stamper
11 Concave-convex portion
11a Convex portion 11b Concave groove
12 Deposition layer
14 Magnetic recording pattern dividing portion
15 Recording track portion
16 Protective film
17 Lubricant layer

BEST MODE FOR CARRYING OUT THE INVENTION

The present invention relates to a method for producing a magnetic recording medium comprising at least a recording layer and a protective film provided on top of a non-magnetic substrate, a so-called patterned medium, discrete medium or bit patterned medium, wherein the method comprises, in the following order, forming a continuous recording layer on the substrate, forming a patterned resist layer, partially removing the recording layer based on the resist pattern, applying an organosilicon compound having an active energy beam-curable functional group onto the recording layer and the regions from which the recording layer has been removed, curing the organosilicon compound with an active energy beam, etching the organosilicon compound to expose a magnetic layer, and forming a protective film.

In the present invention, an organosilicon compound having an active energy beam-curable functional group is used during the production of the non-magnetic regions that surround the magnetic recording pattern. The "organosilicon compound having an active energy beam-curable functional group" of the present invention, is, for example, a compound including the materials shown below in chemical formula 8.

[Chemical formula 8]

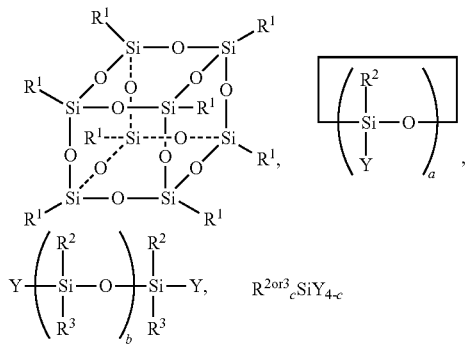

wherein $R^1$ represents Y or $YR^2R^3SiO$—, $R^2$ and $R^3$ each represents an aliphatic group of 1 to 10 carbon atoms or an aromatic hydrocarbon group, a represents 4 or 5, b represents 1 or 2, c represents an integer of 1 to 3, and Y is shown below in chemical formula 9:

[Chemical formula 9]

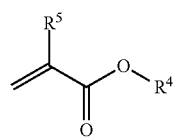
(a)

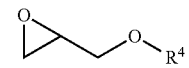
(b)

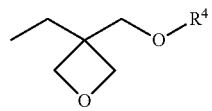
(c)

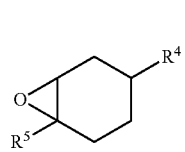

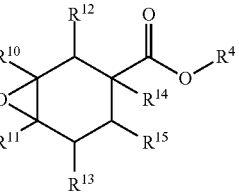

wherein $R^4$ represents one of the structures shown below in chemical formula 10, $R^5$ represents a hydrogen atom or a methyl group, each of $R^{10}$ to $R^{14}$ represents a hydrogen atom, an alkyl group of 1 to 6 carbon atoms, or a trialkylsilyl group of 1 to 4 carbon atoms, and $R^{15}$ represents a hydrogen atom, an alkyl group of 1 to 6 carbon atoms, a trialkylsilyl group of 1 to 4 carbon atoms, or an aryl group,

[Chemical formula 10]

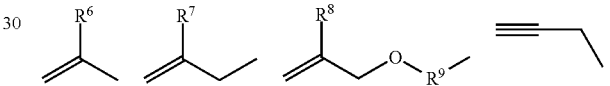

wherein each of $R^6$ to $R^8$ represents a hydrogen atom or a methyl group, and $R^9$ represents an alkylene group of 2 to 8 carbon atoms.

In the present invention, the active energy beam-curable functional group within the aforementioned organosilicon compound is preferably one or more groups selected from the group consisting of an epoxy group, oxetanyl group, and (meth)acryloyl group. By using this type of functional group, the fluidity of the organosilicon compound can be enhanced, and the shrinkage ratio upon curing the organosilicon compound can be reduced. As a result, this organosilicon compound can be used to completely and precisely fill the concave portions of the recording layer, and the compound causes no distortion of the recording layer following curing. Moreover, this compound has a skeleton for which the structure is highly controlled, and therefore when the cured compound is subjected to etching, smooth etched surfaces can be obtained.

Furthermore, in the present invention, the viscosity of the organosilicon compound when applying the organosilicon compound is preferably within a range from 10 mPa·s to 1,000,000 mPa·s at 25° C., and is more preferably from 1,000 mPa·s to 10,000 mPa·s. By using an organosilicon compound having a viscosity within this range, the compound can completely and precisely fill fine concave portions of the recording layer having a minimum width of 100 nm or less and a maximum depth of 20 nm or more. Furthermore, because the surface formed upon solidification is smooth, a smooth surface can be obtained even following etching.

As the organosilicon compound having an active energy beam-curable functional group according to the present invention (hereafter also referred to as "the curable composition"), the use of a silsesquioxane skeleton-containing compound having a silsesquioxane skeleton represented by formula (1) shown below and a curable functional group (hereafter also referred to as "the silsesquioxane skeleton-containing compound") within a molecule is preferred.

[Chemical formula 11]

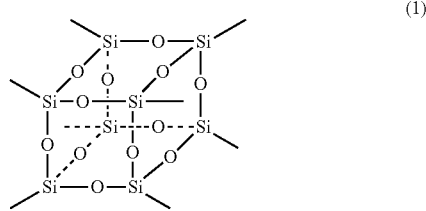

(1)

In the curable composition of the present invention, the silsesquioxane skeleton represented by formula (1) preferably represents at least 5%, and more preferably 8% to 65%, of the molecular weight of the silsesquioxane skeleton-containing compound. If this proportion is less than 5%, then the oxygen etching resistance may deteriorate, whereas if the proportion of the silsesquioxane skeleton represented by formula (1) is too high, then the solubility of the curable composition in solvents tends to worsen, handling of the composition as a filler becomes difficult, the viscosity at any given concentration increases, and the curing rate also tends to slow.

The method used for calculating the % of the silsesquioxane skeleton represented by formula (1) to the molecular weight of the silsesquioxane skeleton-containing compound is as follows.

Namely, the weight of the formula (1) is 416.7, whereas the molecular weight, for example, of the silsesquioxane skeleton-containing compound obtained by reacting octakis(dimethylsilyloxy)silsesquioxane with allyl methacrylate is 2027.26, and therefore the above percentage is calculated as 416.7/2027.6=20.6%.

The silsesquioxane skeleton-containing compound can be produced by performing a hydrosilylation reaction between a cage-type silsesquioxane (A) having Si—H groups and the silsesquioxane skeleton described above, and a compound (B) containing the aforementioned curable functional group and a carbon-carbon unsaturated bond other than the curable functional group.

<Cage-Type Silsesquioxane (A)>

Examples of the cage-type silsesquioxane (A) include compounds represented by formula (2) shown below that contain —Si—H groups within the molecule.

[Chemical formula 12]

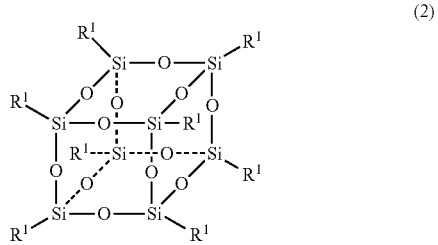

(2)

In the above formula (2), $R^1$ represents a hydrogen atom or $HR^2R^3SiO$—, and $R^2$ and $R^3$ each represents an aliphatic group of 1 to 10 carbon atoms or an aromatic hydrocarbon group.

The silsesquioxane skeleton-containing compound described above can be synthesized using the above cage-type silsesquioxane (A), by reacting this cage-type silsesquioxane with a compound that contains both a carbon-carbon unsaturated bond capable of undergoing a hydrosilylation reaction with a —Si—H group within the cage-type silsesquioxane and another curable functional group (namely, the compound (B)).

Specific examples of the cage-type silsesquioxane (A) represented by formula (2) include octakis(dimethylsilyloxy)silsesquioxane, octakis(methylphenylsilyloxy)silsesquioxane, octakis(dimethylphenylsilyloxy)silsesquioxane, uni(trimethylsilyloxy)-heptakis(dimethylsilyloxy)silsesquioxane, bis(trimethylsilyloxy)-hexakis(dimethylsilyloxy)silsesquioxane, tris(trimethylsilyloxy)-pentakis(dimethylsilyloxy)silsesquioxane, tetrakis(trimethylsilyloxy)-tetrakis(dimethylsilyloxy)silsesquioxane, pentakis(trimethylsilyloxy)-tris(dimethylsilyloxy)silsesquioxane, hexakis(trimethylsilyloxy)-bis(dimethylsilyloxy)silsesquioxane, heptakis(trimethylsilyloxy)-uni(dimethylsilyloxy)silsesquioxane, and hydrogenated silsesquioxane.

Of these compounds, hydrogenated silsesquioxane can be synthesized, for example, using the method disclosed in Inorg. Chem., 30, 2707 (1991), by hydrolysis of trichlorosilane in the presence of a ferric chloride catalyst. Further, octakis(substituted-silyloxy)silsesquioxanes can be synthesized, for example, using the method disclosed in J. Organomet. Chem., 441, 373 (1992), by reaction of the tetramethylammonium salt of $Si_8O_{20}^{8-}$ with a chlorinated alkyl-substituted silicon compound such as dimethylchlorosilane, methylphenylchlorosilane, diphenylchlorosilane or trimethylchlorosilane.

<Compound (B)>

Examples of the carbon-carbon unsaturated bond capable of undergoing a hydrosilylation reaction with an aforementioned —Si—H group include a vinyl group, allyl group, isopropenyl group or propargyl group.

The curable functional group within the silsesquioxane skeleton-containing compound is a curable functional group that undergoes reaction upon heating or active energy beam irradiation, and is preferably a (meth)acryloyl group or epoxy group that undergoes reaction upon active energy beam irradiation. In the present invention, the term "epoxy group" includes not only the normal meaning of a group having a triangular structure in which two carbon atoms that are bonded directly to one another are also linked via a bridging oxygen atom, but also groups having a structure in which two carbon atoms bonded together either directly or via other atoms (mainly carbon atoms) are linked via a bridging oxygen atom, such as a glycidyl group, oxetanyl group or cyclohexene oxide group.

Specific examples of compounds having both of these functional groups within the same molecule, namely compounds that contain both a curable functional group and a carbon-carbon unsaturated bond other than the curable functional group (namely, the compound (B)), include compounds containing an epoxy group and an allyl group such as allyl glycidyl ether, 1,2-epoxy-4-vinylcyclohexane, and allyl 3,4-epoxycyclohexanecarboxylate, compounds containing a (meth)acryloyl group and an allyl group such as allyl (meth)acrylate, ethylene glycol monoallyl ether (meth)acrylate, diethylene glycol monoallyl ether (meth)acrylate, propylene glycol monoallyl ether (meth)acrylate and dipropylene glycol monoallyl ether (meth)acrylate, as well as propargyl (meth)acrylate and the allyl ether of 3-methyl-3-hydroxymethyloxetane.

As the compound (B), compounds having a (meth)acryloyl group or an epoxy group such as a cyclohexene oxide group that is able to undergo curing with an active energy beam are preferred.

Other specific examples of the compound (B) include compounds (a) to (c) represented by the structural formulas shown below.

[Chemical formula 13]

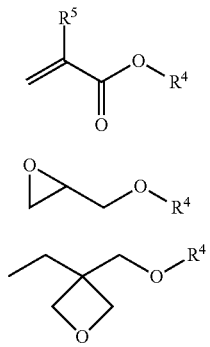

(a)

(b)

(c)

In the above formulas, $R^4$ represents one of the structures shown below in chemical formula 14, and $R^5$ represents a hydrogen atom or a methyl group.

[Chemical formula 14]

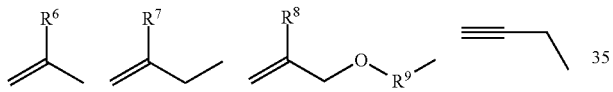

In the above formulas, each of $R^6$ to $R^8$ represents a hydrogen atom or a methyl group, and $R^9$ represents an alkylene group of 2 to 8 carbon atoms.

<Method for Producing Silsesquioxane Skeleton-Containing Compound>

The silsesquioxane skeleton-containing compound containing a curable functional group according to the present invention is produced by bonding, via a hydrosilylation reaction, the cage-type silsesquioxane (A) having Si—H groups and the specific silsesquioxane skeleton described above, and the compound (B) containing a curable functional group and a carbon-carbon unsaturated bond other than the curable functional group.

A typical hydrosilylation reaction is illustrated below in chemical formula 15.

[Chemical formula 15]

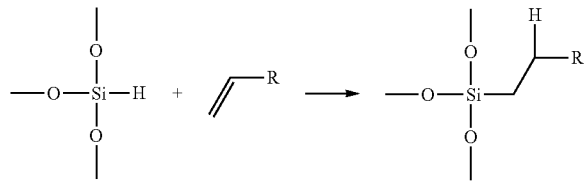

For example, in the case where octakis(dimethylsilyloxy) silsesquioxane of formula (d) shown below is reacted as the cage-type silsesquioxane (A) with allyl methacrylate of formula (e) shown below as the compound (B), a compound having the structure represented by formula (f) shown below is mainly produced.

[Chemical formula 16]

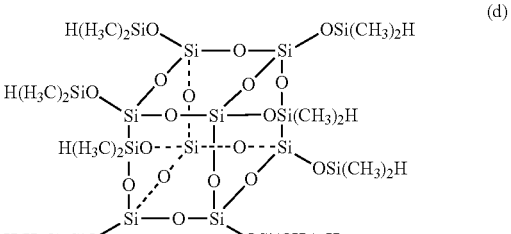

(d)

[Chemical formula 17]

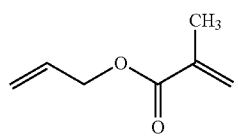

(e)

[Chemical formula 18]

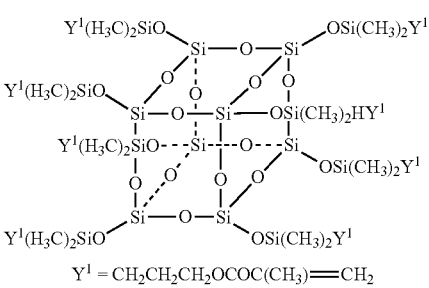

(f)

$Y^1 = CH_2CH_2CH_2OCOC(CH_3)=CH_2$

The silsesquioxane skeleton-containing compound having curable functional groups according to the present invention can be produced by the above method, namely by reacting the cage-type silsesquioxane (A) and the compound (B). Further, a portion of the compound (B) may be replaced with other compounds having only a carbon-carbon double bond capable of reacting with a —Si—H bond, provided this does not impair the subsequent curing reaction.

Examples of these other compounds include allyl alcohol, 1-pentene, 1-hexene, 1-octene, styrene and vinyltoluene.

Further, although care must be taken to avoid gelling, a small amount of a compound having a plurality of unsaturated groups may be used as the other compound having only a carbon-carbon double bond.

Specific examples of this compound include diallyl ether, dimethyldivinylsilane, divinylmethylphenylsilane, diphenyldivinylsilane, 1,4-bis(dimethylvinylsilyl)benzene, 1,1,3,3-tetraphenyldivinylsiloxane, 1,3-divinyl-1,1,3,3-tetramethyldisiloxane, 1,3-bis(dimethylvinylsiloxy)benzene, 1,4-bis(dimethylvinylsiloxy)benzene and tetravinylsilane.

The amount used of these types of compounds must be limited to a molar ratio that does not cause gelling upon reaction with the polyfunctional hydrogenated silsesquioxane.

Furthermore, as the compound having Si—H groups, compounds having Si—H groups other than the cage-type silsesquioxane (A) having Si—H groups and the specific silsesquioxane skeleton described above may be used in combination with the cage-type silsesquioxane (A) during production of the silsesquioxane skeleton-containing compound, provided the selectivity of the etching rate for the cured product of the curable composition is not impaired.

Examples of these other compounds include compounds having two or more hydrogen atoms bonded to silicon atoms, including monoalkylsilanes such as phenylsilane and dialkylsilanes such as diphenylsilane and methylphenylsilane, as well as polyhydrogensiloxane compounds represented by the general formulas shown below in chemical formula 19.

[Chemical formula 19]

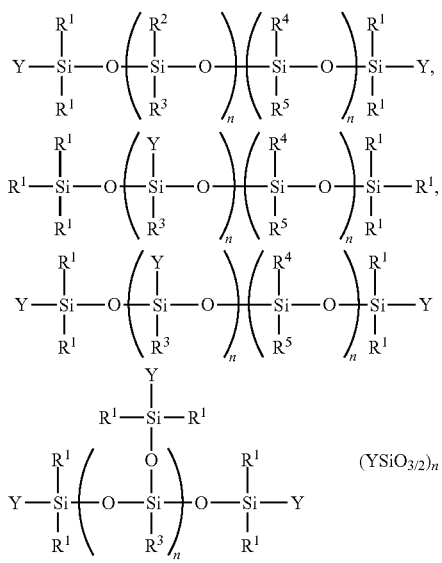

In the above formulas, $R^1$ represents an alkyl group of 1 to 5 carbon atoms, each of $R^2$ to $R^5$ represents an alkyl group of 1 to 8 carbon atoms or a phenyl group, $(YSiO_{3/2})_n$ represents a cage-type or ladder-type silsesquioxane, m and n each independently represents an integer of 1 to 500, and Y represents one of the structures shown below in chemical formula 20.

[Chemical formula 20]

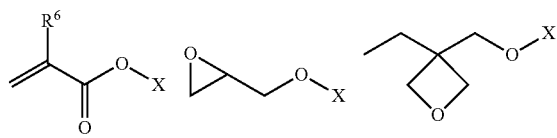

In the above formulas, $R^6$ represents a hydrogen atom or a methyl group, and X represents one of the structures shown below in chemical formula 21.

[Chemical formula 21]

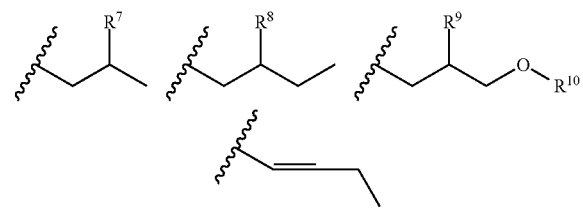

In the above formulas, each of $R^7$ to $R^9$ independently represents a hydrogen atom or a methyl group, and $R^{10}$ represents an alkylene group of 2 to 8 carbon atoms. Further, the position indicated by the wavy line in each of the above structures represents the site of the bond to the Si atom.

In terms of the proportions of the cage-type silsesquioxane (A) and the compound (B) used when conducting the hydrosilylation reaction to produce the silsesquioxane skeleton-containing compound, the proportions are preferably adjusted so that the number of carbon-carbon unsaturated bonds capable of reacting with an Si—H group is larger than the number of Si—H groups. Namely, the molar ratio of (carbon-carbon unsaturated bonds)/Si—H groups is preferably not less than 1.0, and is more preferably within a range from 1.02 to 1.50.

In terms of the reaction method, the compound (B) is preferably reacted first with the cage-type silsesquioxane (A), with the aforementioned low-boiling point compounds containing only a carbon-carbon double bond and having no curable functional group reacted after the reaction with the compound (B). The reason for this is that any excess amount of the compounds containing only a carbon-carbon double bond can be readily removed by distillation or the like.

Further, the fine pattern transfer step using the curable composition may be performed with residual compound (B) still contained within the organosilicon compound having an active energy beam-curable functional group.

A catalyst is preferably used when performing the above hydrosilylation reaction. Examples of this type of addition reaction catalyst include platinum catalysts, rhodium catalysts, palladium catalysts and ruthenium catalysts, and of these, platinum catalysts are preferred. Specific examples of platinum catalysts include chloroplatinic acid, reaction products of chloroplatinic acid and alcohols, reaction products of chloroplatinic acid and olefin compounds, reaction products of chloroplatinic acid and vinyl group-containing siloxanes, platinum olefin complexes, platinum vinyl group-containing siloxane complexes, and platinum carbonyl complexes. These catalysts are preferably dissolved or dispersed in a solvent such as an alcohol prior to use.

Specifically, a 2% xylene solution of a divinyltetramethyldisiloxane platinum complex (manufactured by GELEST Inc.) or the like may be used.

There are no particular limitations on the amount used of the addition reaction catalyst, and the amount need only be sufficient to ensure an effective reaction. Specifically, the amount of the metal element such as platinum is within a range from 0.01 to 10,000 ppm and is preferably from 0.1 to 1,000 ppm as a mass ratio relative to the total amount of the raw materials used in the hydrosilylation reaction, namely, the combination of the cage-type silsesquioxane (A) and the compound (B), or in some cases the combination of these two compounds together with any compounds having only a carbon-carbon double bond capable of reacting with a —Si—H bond other than the compound (B) and any compounds having Si—H groups other than the cage-type silsesquioxane (A).

The reaction temperature for the above hydrosilylation reaction is typically within a range from 0 to 250° C. In terms of preventing polymerization reactions of the functional group that functions as the curable functional group of the silsesquioxane skeleton-containing compound, the reaction temperature is preferably within a range from 0 to 100° C. Further, the reaction rate can sometimes be slow depending on the nature of the raw materials, and in such cases heating is preferably conducted at a temperature of 40° C. or higher, although if heating is performed, then it may be desirable to add a polymerization inhibitor to the reaction system depending on the nature of the curable functional group.

Furthermore, the above reaction may sometimes become unstable in the presence of moisture, and therefore, if required, the reaction may be performed under an atmosphere of argon or nitrogen.

These reactions are extremely exothermic, and a reaction solvent may be used if required. Examples of this reaction solvent include aromatic hydrocarbon solvents such as toluene and xylene; aliphatic hydrocarbon solvents such as hexane and octane; ketone-based solvents such as methyl ethyl ketone and methyl isobutyl ketone; ester-based solvents such as ethyl acetate, isobutyl acetate and propylene glycol monomethyl ether acetate; ether-based solvents such as diisopropyl ether and 1,4-dioxane; alcohol-based solvents such as isopropanol propylene glycol mono-n-propyl ether and ethylene glycol monoethyl ether, and mixtures of the above solvents.

Of these solvents, an aromatic hydrocarbon solvent or aliphatic hydrocarbon solvent is preferred. Further, a cyano group-containing compound may also be used as the reaction solvent.

<Other Components within the Organosilicon Compound having an Active Energy Beam-Curable Functional Group>

In those cases where the curable functional group within the silsesquioxane skeleton-containing compound contained within the organosilicon compound having an active energy beam-curable functional group of the present invention is a (meth)acryloyl group, a radical homopolymerization of the silsesquioxane skeleton-containing compound, a radical polymerization of the silsesquioxane skeleton-containing compound in the presence of another compound having a functional group capable of undergoing copolymerization with a (meth)acryloyl group, or a radical polymerization of the silsesquioxane skeleton-containing compound that includes a polyaddition with a polythiol may be conducted.

Further, in those cases where the curable functional group is an epoxy group, a cationic homopolymerization of the silsesquioxane skeleton-containing compound, a cationic polymerization of the silsesquioxane skeleton-containing compound in the presence of a compound having a functional group such as a vinyl ether group that is capable of undergoing copolymerization with an epoxy group, or a polymerization such as a polyaddition that uses an acid anhydride as a curing agent may be conducted.

If the curable functional group within the silsesquioxane skeleton-containing compound is a meth(acryloyl) group, then when the organosilicon compound having an active energy beam-curable functional group according to the present invention is subjected to curing using the method described below, if a radical polymerization of the silsesquioxane skeleton-containing compound is conducted in the presence of another compound having a functional group capable of undergoing copolymerization with a (meth)acryloyl group, then the curing rate during the curing of the organosilicon compound having an active energy beam-curable functional group according to the present invention can be adjusted.

Examples of this compound having a functional group capable of undergoing copolymerization with a (meth)acryloyl group include compounds having a (meth)acryloyl group, styryl group, vinyl group, allyl group, maleyl group or fumaryl group or the like, although of these, compounds having a (meth)acryloyl group are preferred, and monomers or oligomers having one or more (meth)acrylate ester structures are particularly desirable.

As these monomers or oligomers having one or more (meth)acrylate ester structures, either monofunctional or polyfunctional (meth)acrylates may be used, and specific examples include methyl(meth)acrylate, ethyl(meth)acrylate, n-propyl(meth)acrylate, isopropyl(meth)acrylate, n-butyl(meth)acrylate, isobutyl(meth)acrylate, sec-butyl(meth)acrylate, hexyl(meth)acrylate, octyl(meth)acrylate, 2-ethylhexyl(meth)acrylate, decyl(meth)acrylate, isobornyl(meth)acrylate, cyclohexyl(meth)acrylate, phenyl(meth)acrylate, benzyl(meth)acrylate, 2-hydroxyethyl(meth)acrylate, 2-hydroxypropyl(meth)acrylate, 3-hydroxypropyl(meth)acrylate, 2-hydroxybutyl(meth)acrylate, 2-hydroxyphenylethyl(meth)acrylate, ethylene glycol di(meth)acrylate, propylene glycol di(meth)acrylate, 1,4-butanediol di(meth)acrylate, diethylene glycol di(meth)acrylate, triethylene glycol di(meth)acrylate, trimethylolpropane di(meth)acrylate, trimethylolpropane tri(meth)acrylate, pentaerythritol penta(meth)acrylate, N,N-dimethyl(meth)acrylamide, N,N-diethyl(meth)acrylamide and N-acryloylmorpholine.

Further examples of compounds having a functional group capable of undergoing copolymerization with a (meth)acryloyl group include so-called epoxy acrylates produced by the addition of (meth)acrylic acid to an epoxy resin, such as bisphenol A epoxy resins, hydrogenated bisphenol A epoxy resins, brominated bisphenol A epoxy resins, bisphenol F epoxy resins, novolak epoxy resins, phenol novolak epoxy resins, cresol novolak epoxy resins, alicyclic epoxy resins, N-glycidyl epoxy resins, bisphenol A novolak epoxy resins, chelated epoxy resins, glyoxal epoxy resins, amino group-containing epoxy resins, rubber-modified epoxy resins, dicyclopentadiene phenolic epoxy resins, silicone-modified epoxy resins and E-caprolactone-modified epoxy resins.

Yet more examples of compounds having a functional group capable of undergoing copolymerization with a (meth)acryloyl group include the compounds listed below.

Urethane acrylates obtained by reacting a polyisocyanate compound such as 2,4- or 2,6-tolylene diisocyanate, m- or p-xylylene diisocyanate, hydrogenated xylylene diisocyanate, diphenylmethane-4,4'-diisocyanate and modified compounds or polymers thereof, hexamethylene diisocyanate, isophorone diisocyanate, 1,4-tetramethylene diisocyanate or naphthalene diisocyanate, with an active hydrogen-containing (meth)acrylate monomer such as 2-hydroxyethyl(meth)acrylate, 2-hydroxypropyl(meth)acrylate, tripropylene glycol(meth)acrylate, 1,4-butylene glycol mono(meth)acrylate, 2-hydroxy-3-chloropropyl(meth)acrylate, glycerol mono(meth)acrylate, glycerol di(meth)acrylate, glycerol methacrylate acrylate, trimethylolpropane di(meth)acrylate or pentaerythritol tri(meth)acrylate may also be used.

Styrene and derivatives thereof may also be used as compounds having a functional group capable of undergoing copolymerization with a (meth)acryloyl group, and specific examples include styrene, 2,4-dimethyl-α-methylstyrene, o-methylstyrene, m-methylstyrene, p-methylstyrene, 2,4-dimethylstyrene, 2,5-dimethylstyrene, 2,6-dimethylstyrene, 3,4-dimethylstyrene, 3,5-dimethylstyrene, 2,4,6-trimethylstyrene, 2,4,5-trimethylstyrene, pentamethylstyrene, o-ethylstyrene, m-ethylstyrene, p-ethylstyrene, o-chlorostyrene, m-chlorostyrene, p-chlorostyrene, o-bromostyrene, m-bromostyrene, p-bromostyrene, o-methoxystyrene, m-methoxystyrene, p-methoxystyrene, o-hydroxystyrene, m-hydroxystyrene, p-hydroxystyrene, 2-vinylbiphenyl, 3-vinylbiphenyl, 4-vinylbiphenyl, 1-vinylnaphthalene, 2-vinylnaphthalene, 4-vinyl-p-terphenyl, 1-vinylanthracene, α-methylstyrene, o-isopropenyltoluene, m-isopropenyltoluene, p-isopropenyltoluene, 2,4-dimethyl-α-methylstyrene, 2,3-dimethyl-α-methylstyrene, 3,5-dimethyl-α-methylstyrene, p-isopropyl-α-methylstyrene, α-ethylstyrene, α-chlorostyrene, divinylbenzene, divinylbiphenyl and diisopropylbenzene.

(Meth)acrylonitrile and derivatives thereof may also be used as compounds having a functional group capable of undergoing copolymerization with a (meth)acryloyl group, and specific examples include acrylonitrile and methacrylonitrile.

Vinyl esters of organic carboxylic acids and derivatives thereof may also be used as compounds having a functional group capable of undergoing copolymerization with a (meth)acryloyl group, and specific examples include vinyl acetate, vinyl propionate, vinyl butyrate, vinyl benzoate and divinyl adipate.

Allyl esters of organic carboxylic acids and derivatives thereof may also be used as compounds having a functional group capable of undergoing copolymerization with a (meth)acryloyl group, and specific examples include allyl acetate, allyl benzoate, diallyl adipate, diallyl terephthalate, diallyl isophthalate and diallyl phthalate.

Dialkyl esters of fumaric acid and derivatives thereof may also be used as compounds having a functional group capable of undergoing copolymerization with a (meth)acryloyl group, and specific examples include dimethyl fumarate, diethyl fumarate, diisopropyl fumarate, di-sec-butyl fumarate, diisobutyl fumarate, di-n-butyl fumarate, di-2-ethylhexyl fumarate and dibenzyl fumarate.

Dialkyl esters of maleic acid and derivatives thereof may also be used as compounds having a functional group capable of undergoing copolymerization with a (meth)acryloyl group, and specific examples include dimethyl maleate, diethyl maleate, diisopropyl maleate, di-sec-butyl maleate, diisobutyl maleate, di-n-butyl maleate, di-2-ethylhexyl maleate and dibenzyl maleate.

Dialkyl esters of itaconic acid and derivatives thereof may also be used as compounds having a functional group capable of undergoing copolymerization with a (meth)acryloyl group, and specific examples include dimethyl itaconate, diethyl itaconate, diisopropyl itaconate, di-sec-butyl itaconate, diisobutyl itaconate, di-n-butyl itaconate, di-2-ethylhexyl itaconate and dibenzyl itaconate.

N-vinylamide derivatives of organic carboxylic acids may also be used as compounds having a functional group capable of undergoing copolymerization with a (meth)acryloyl group, and specific examples include N-methyl-N-vinylacetamide.

Maleimide and derivatives thereof may also be used as compounds having a functional group capable of undergoing copolymerization with a (meth)acryloyl group, and specific examples include N-phenylmaleimide and N-cyclohexylmaleimide.

In the case of a radical polymerization that also includes a polyaddition with a polythiol, examples of the polythiol compound that can be used in combination with the (meth)acrylic acid group include 2,2-bis(mercaptomethyl)-1,3-propanedithiol, bis(2-mercaptoethyl)ether, ethylene glycol bis(2-mercaptoacetate), ethylene glycol bis(3-mercaptopropionate), trimethylolpropane-tris(β-thiopropionate), tris(2-hydroxyethyl) isocyanurate-tris(β-mercaptopropionate), pentaerythritol tetrakis(β-thiopropionate), 1,8-dimercapto-3,6-dioxaoctane, 1,2,3-trimercaptobenzene, 1,2,4-trimercaptobenzene, 1,3,5-trimercaptobenzene, 1,2,3-tris(mercaptomethyl)benzene, 1,2,4-tris(mercaptomethyl)benzene and 1,3,5-tris(mercaptomethyl)benzene.

If the curable functional group within the silsesquioxane skeleton-containing compound is an epoxy group, then when the organosilicon compound having an active energy beam-curable functional group according to the present invention is subjected to curing using the method described below, if a cationic polymerization of the silsesquioxane skeleton-containing compound is conducted in the presence of another compound having a functional group capable of undergoing copolymerization with an epoxy group, then the curing rate during the curing of the organosilicon compound having an active energy beam-curable functional group according to the present invention can be adjusted.

Examples of this other compound having a functional group capable of undergoing copolymerization with an epoxy group include compounds having a vinyl ether group, and specific examples of these compounds include triethylene glycol divinyl ether, tetraethylene glycol divinyl ether, trimethylolpropane trivinyl ether, cyclohexane-1,4-dimethylol divinyl ether, 1,4-butanediol divinyl ether, polyester divinyl ether and polyurethane polyvinyl ether.

Further examples of compounds having a functional group capable of undergoing copolymerization with an epoxy group include epoxy compounds having two or more epoxy groups within each molecule, such as bisphenol A epoxy resins, hydrogenated bisphenol A epoxy resins, brominated bisphenol A epoxy resins, bisphenol F epoxy resins, novolak epoxy resins, phenol novolak epoxy resins, cresol novolak epoxy resins, alicyclic epoxy resins, N-glycidyl epoxy resins, bisphenol A novolak epoxy resins, chelated epoxy resins, glyoxal epoxy resins, amino group-containing epoxy resins, rubber-modified epoxy resins, dicyclopentadiene phenolic epoxy resins, silicone-modified epoxy resins and ε-caprolactone-modified epoxy resins.

Specific examples of the above epoxy compounds include:

bisphenol A epoxy resins such as the products EPIKOTE 828, 1002 and 1004, manufactured by Japan Epoxy Resins Co., Ltd., bisphenol F epoxy resins such as the products EPIKOTE 806, 807 and 4005P manufactured by Japan Epoxy Resins Co., Ltd., and the product YDF-170 manufactured by Tohto Kasei Co., Ltd., phenol novolak epoxy resins such as the products EPIKOTE 152 and 154 manufactured by Japan Epoxy Resins Co., Ltd., and the product EPPN-201 manufactured by Nippon Kayaku Co., Ltd., o-cresol novolak epoxy resins such as the products EOCN-1255, 103S and 104S, manufactured by Nippon Kayaku Co., Ltd., biphenyl epoxy resins such as the products EPIKOTE YX-4000 and YL-6640, manufactured by Japan Epoxy Resins Co., Ltd., polyfunctional epoxy resins such as the product EPIKOTE 1031S manufactured by Japan Epoxy Resins Co., Ltd., the product ARALDITE 0163 manufactured by Ciba Specialty Chemicals Inc., and the products DENACOL EX-611, EX-614, EX-614B, EX-622, EX-512, EX-521, EX-421, EX-411 and EX-321 manufactured by Nagase ChemteX Corporation, amine epoxy resins such as the product EPIKOTE 604 manufactured by Japan Epoxy Resins Co., Ltd., the product YH-434 manufactured by Tohto Kasei Co., Ltd., the products TETRAD-X and TETRAD-C manufactured by Mitsubishi Gas Chemical Company, Inc., the product GAN manufactured by Nippon Kayaku Co., Ltd., and the product ELM-120 manufactured by Sumitomo Chemical Co., Ltd., heterocycle-containing epoxy resins such as the product ARALDITE PT810 manufactured by Ciba Specialty Chemicals Inc., alicyclic epoxy resins such as the products EHPE3150, EHPE3150CE, CELLOXIDE 2000, CELLOXIDE 2021, CELLOXIDE 2081, EPOLEAD PB3600 and EPOLEAD GT401, manufactured by Daicel Chemical Industries, Ltd., and epoxylated polybutadienes such as the product EPOLEAD PB3600 manufactured by Daicel Chemical Industries, Ltd.

The above compounds may be used individually, or in combinations containing two or more different compounds.

Further, compounds having an oxetanyl group may also be used, and specific examples of these compounds include 1,3-bis[(3-ethyl-3-oxetanylmethoxy)methyl]propane, ethylene glycol bis(3-ethyl-3-oxetanylmethyl)ether, trimethylolpropane tris(3-ethyl-3-oxetanylmethyl)ether, pentaerythritol tetrakis(3-ethyl-3-oxetanylmethyl) ether, dipentaerythritol hexakis(3-ethyl-3-oxetanylmethyl)ether, and 2-ethyl-2-hydroxymethyloxetane.

In those cases where the aforementioned curable functional group is an epoxy group, and in particular a glycidyl group, an acid anhydride compound may be used as the curing agent, with curing proceeding via a polyaddition. Specific examples of the acid anhydride compound include aromatic acid anhydrides such as phthalic anhydride, trimellitic anhydride and pyromellitic anhydride; and cyclic aliphatic acid anhydrides such as tetrahydrophthalic anhydride, methyltetrahydrophthalic anhydride, hexahydrophthalic anhydride and methylhexahydrophthalic anhydride.

The amount used of this acid anhydride, relative to the amount of epoxy groups, is within a range from 0.7 to 1.2 equivalents, and preferably from 0.8 to 1.1 equivalents. Further, an imidazole, tertiary amine or organophosphine compound may also be used as a curing accelerator.

In order to cure the curable composition of the present invention, either an active energy beam curing method or a heat curing method may be used, and particularly in the cases of the radical polymerization and cationic polymerization mentioned above, the most appropriate polymerization initiator for the selected polymerization method may also be added as required.

In those cases where the curable functional group is a (meth)acryloyl group, or the curable functional group is a (meth)acryloyl group and the curable composition also includes an aforementioned polythiol compound, a radical polymerization initiator is preferably used.

In the case of a thermal polymerization, examples of thermal radical initiators that may be used include organic peroxides such as methyl ethyl ketone peroxide, cyclohexanone peroxide, methylcyclohexanone peroxide, methyl acetate peroxide, acetyl acetate peroxide, 1,1-bis(t-butylperoxy)butane, 1,1-bis(t-butylperoxy)cyclohexane, 1,1-bis(t-butylperoxy)-2-methylcyclohexane, 1,1-bis(t-butylperoxy)-3,3,5-trimethylcyclohexane, 1,1-bis(t-butylperoxy)cyclododecane, 1,1-bis(t-hexylperoxy)cyclohexane, 1,1-bis(t-hexylperoxy)-3,3,5-trimethylcyclohexane, 2,2-bis(4,4-di-t-butylperoxycyclohexyl)propane, t-butyl hydroperoxide, t-hexyl hydroperoxide, 1,1,3,3-tetramethylbutyl hydroperoxide, cumene hydroperoxide, p-methyl hydroperoxide, diisopropylbenzene hydroperoxide, di-t-butyl peroxide, dicumyl peroxide, t-butylcumyl peroxide, α,α'-bis(t-butylperoxy)diisopropylbenzene, 2,5-dimethyl-2,5-bis(t-butylperoxy)hexane, 2,5-dimethyl-2,5-bis(t-butylperoxy)hexyne-3, isobutyryl peroxide, 3,3,5-trimethylhexanoyl peroxide, octanoyl peroxide, lauroyl peroxide, stearoyl peroxide, succinic acid peroxide, m-toluoyl benzoyl peroxide, benzoyl peroxide, di-n-propyl peroxydicarbonate, diisopropyl peroxydicarbonate, bis(4-t-butylcyclohexyl)peroxydicarbonate, di-2-ethoxyethyl peroxydicarbonate, di-2-ethoxyhexyl peroxydicarbonate, di-3-methoxybutyl peroxydicarbonate, di-s-butyl peroxydicarbonate, di(3-methyl-3-methoxybutyl)peroxydicarbonate, α,α'-bis(neodecanoylperoxy)diisopropylbenzene, t-butyl peroxyneodecanoate, t-hexyl peroxyneodecanoate, 1,1,3,3-tetramethylbutyl peroxyneodecanoate, 1-cyclohexyl-1-methylethyl peroxyneodecanoate, cumyl peroxyneodecanoate, t-butyl peroxypivalate, t-hexyl peroxypivalate, t-butyl peroxy-2-ethylhexanoate, t-hexyl peroxy-2-ethylhexanoate, 1,1,3,3-tetramethylbutyl peroxy-2-ethylhexanoate, 2,5-dimethyl-2,5-bis(2-ethylhexanoylperoxy)hexane, 1-cyclohexyl-1-methylethyl peroxy-2-ethylhexanoate, t-butyl peroxy-3,5,5-trimethylhexanoate, t-butyl peroxyisopropyl monocarbonate, t-hexyl peroxyisopropyl monocarbonate, t-butyl peroxy-2-ethylhexyl monocarbonate, t-butyl peroxyallyl monocarbonate, t-butyl peroxyisobutyrate, t-butyl peroxymaleate, t-butyl peroxybenzoate, t-hexyl peroxybenzoate, t-butyl peroxy-m-toluoylbenzoate, t-butyl peroxylaurate, t-butyl peroxyacetate, bis(t-butylperoxy) isophthalate, 2,5-dimethyl-2,5-bis(m-toluoylperoxy)hexane, 2,5-dimethyl-2,5-bis(benzoylperoxy)hexane, t-butyl trimethylsilyl peroxide, 3,3', 4,4'-tetra(t-butylperoxycarbonyl)benzophenone and 2,3-dimethyl-2,3-diphenylbutane; and azo compounds such as 1-[(1-cyano-1-methylethyl)azo]formamide, 1,1'-azobis(cyclohexane-1-carbonitrile), 2,2'-azobis(2-methylbutyronitrile), 2,2'-azobisisobutyronitrile, 2,2'-azobis(2,4-dimethyl-4-methoxyvaleronitrile), 2,2'-azobis(2,4-dimethylvaleronitrile), 2-phenylazo-4-methoxy-2,4-dimethylvaleronitrile, 2,2'-azobis(2-methylpropionamidine) dihydrochloride, 2,2-azobis(2-methyl-N-phenylpropionamidine)dihydrochloride, 2,2'-azobis[N-(4-chlorophenyl)-2-methylpropionamidine]dihydrochloride, 2,2'-azobis[N-(4-hydrophenyl)-2-methylpropionamidine]dihydrochloride, 2,2'-azobis[2-methyl-N-(2-propenyl)propionamidine]dihydrochloride, 2,2'-azobis[N-(2-hydroxyethyl)-2-methylpropionamidine]dihydrochloride, 2,2'-azobis[2-methyl-N-(phenylmethyl)propionamidine]dihydrochloride, 2,2'-azobis[2-(2-imidazolin-2-yl)propane]dihydrochloride, 2,2'-azobis[2-(2-imidazolin-2-yl)propane]dihydrochloride, 2,2'-azobis[2-(5-methyl-2-imidazolin-2-yl)propane]dihydrochloride, 2,2'-azobis {2-[1-(2-hydroxyethyl)-2-imidazolin-2-yl]propane}dihydrochloride, 2,2'-azobis[2-(4,5,6,7-tetrahydro-1H-1,3-diazepin-2-yl)propane]dihydrochloride, 2,2'-azobis[2-(3,4,5,6-tetrahydropyrimidin-2-yl)propane] dihydrochloride, 2,2'-azobis[2-(5-hydroxy-3,4,5,6-tetrahydropyrimidin-2-yl)propane]dihydrochloride, 2,2'-azobis(2-methylpropionamide), 2,2'-azobis[2-methyl-N-(2-hydroxyethyl)propionamide], 2,2'-azobis{2-methyl-N-[1,1-bis(hydroxymethyl)-2-hydroxyethyl]propionamide}, 2,2'-azobis{2-methyl-N-[1,1-bis(hydroxymethyl)ethyl] propionamide}, 2,2'-azobis(2-methylpropane), 2,2'-azobis (2,4,4-trimethylpentane), dimethyl 2,2'-azobis(2-methylpropionate), 4,4'-azobis(4-cyanopentanoic acid) and 2,2'-azobis[2-(hydroxymethyl)propionitrile].

Examples of polymerization initiators that may be used in those cases where the curable functional group is an epoxy group include imidazoles such as melamine, imidazole, 2-methylimidazole, 2-undecylimidazole, 2-heptacylimidazole, 2-ethyl-4-ethylimidazole, 2-phenylimidazole, 2-phenyl-4-methylimidazole, 1-benzyl-2-methylimidazole, 1-benzyl-2-phenylimidazole, 1,2-dimethylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyls-triazine, 2,4-diamino-6-[2'-ethyl-4'-imidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-methylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 4,4'-methylenebis(2-ethyl-5-methylimidazole) and 1-dodecyl-2-methyl-3-benzylimidazolium chloride; organic strong bases and salts thereof such as 1,8-diazabicyclo(5.4.0)undecene-7 and the phenol salt, octylate, p-toluenesulfonate, formate, ortho-phthalate and phenol novolak resin salt thereof, and 1,5-diazabicyclo(4.3.0)nonene-5 and the phenol novolak resin salt thereof; anionic initiators such as quaternary phosphonium bromide and ureas such as aromatic dimethylurea and aliphatic dimethylurea; silanol-based cationic catalysts such as triphenylsilanol; and aluminum chelate-based catalysts such as aluminum tris(acetylacetone).

Furthermore, there are no particular limitations on the active energy beam used within the method for forming a fine pattern according to the present invention, and provided that it acts upon the functional group of the silsesquioxane skeleton-containing compound and causes curing of the curable composition may be used. Specific examples of the active energy beam include ultraviolet, X-ray radiation, and an electron beam. Of these, the use of ultraviolet or an electron beam is preferred.

In those cases where an electron beam is used, the (meth)acryloyl groups undergo reaction and cause curing even without the use of a polymerization initiator. Depending on the particular combination of the active energy beam and the functional group used within the composition of the present invention, a polymerization initiator is preferably added as required.

In those cases where the curable functional group is a (meth)acryloyl group, or the curable functional group is a (meth)acryloyl group and the curable composition also includes a polythiol compound, examples of the polymerization initiators include acetophenone-based photoradical polymerization initiators such as 4-phenoxydichloroacetophenone, 4-t-butyl-dichloroacetophenone, 4-t-butyl-trichloroacetophenone, diethoxyacetophenone, 2-hydroxy-2-cyclohexylacetophenone, 2-hydroxy-2-methyl-1-phenylpropan-1-one, 2-hydroxy-2-phenyl-1-phenylpropan-1-one, 1-(4-dodecylphenyl)-2-hydroxy-2-methylpropan-1-one, 1-(4-isopropylphenyl)-2-hydroxy-2-methylpropan-1-one, 4-(2-hydroxyethoxy)-phenyl-(2-hydroxy-2-propyl) ketone, 1-hydroxycyclohexyl phenyl ketone and 2-methyl-1[4-(methylthio)phenyl]-2-morpholinopropane-1; benzoin-based photoradical polymerization initiators such as benzoin, benzoin methyl ether, benzoin isopropyl ether, benzoin isobutyl ether and benzyl methyl ketal; benzophenone-based photoradical polymerization initiators such as benzophenone, benzoylbenzoic acid, methyl benzoylbenzoate, 4-phenylbenzophenone, hydroxybenzophenone, acrylated benzophenone, 4-benzoyl-4'-methyldiphenyl sulfide, 3,3'-dimethyl-4-methoxybenzophenone, 4,4'-dimethylaminobenzophenone, 4,4'-diethylaminobenzophenone and 3,3',4,4'-tetra(t-butylperoxycarbonyl)benzophenone; thioxanthone-based photoradical polymerization initiators such as thioxanthone, 2-chlorothioxanthone, 2-methylthioxanthone, 2,4-dimethylthioxanthone, 2,4-diethylthioxanthone, 2,4-diisopropylthioxanthone, isopropylthioxanthone, 1-chloro-4-propoxythioxanthone and 2,4-dichlorothioxanthone; ketone-based photoradical polymerization initiators such as α-acyloxime ester, methyl phenyl glyoxylate, benzil, 9,10-phenanthrenequinone, camphorquinone, dibenzosuberone, 2-ethylanthraquinone and 4',4''-diethylisophthalophenone; imidazole-based photoradical polymerization initiators such as 2,2'-bis(2-chlorophenyl)-4,4',5,5'-tetraphenyl-1,2'-imidazole; acylphosphine oxide-based photoradical polymerization initiators such as 2,4,6-trimethylbenzoyldiphenylphosphine oxide; carbazole-based photoradical polymerization initiators; and Lewis acid onium salt-based photoradical polymerization initiators such as triphenylphosphonium hexafluoroantimonate, triphenylphosphonium hexafluorophosphate, p-(phenylthio)phenyldiphenylsulfonium hexafluoroantimonate, 4-chlorophenyldiphenylsulfonium hexafluorophosphate and (2,4-cyclopentadien-1-yl)[(1-methylethyl)benzene]-iron-hexafluorophosphate.

In those cases where the curable functional group is an epoxy group, or the curable functional group is an epoxy group and the curable composition also includes a compound having a vinyl ether group, examples of photocationic polymerization initiators that may be used include sulfonium salt-based initiators such as triphenylsulfonium hexafluoroantimonate, as well as iodonium salt-based initiators, diazonium salt-based initiators and allene-ion complex-based initiators.

The above polymerization initiators may be used individually, or in combinations containing two or more different initiators. The amount used of the polymerization initiator is preferably within a range from 0.01 to 10 parts by mass per 100 parts by mass of the curable composition.

Besides the polymerization initiator and curing agent, other additives such as viscosity modifiers, dispersants and surface modifiers may also be added to the curable composition of the present invention. If such additives are added to the curable composition, then the total amount of the additives is preferably not more than 30 parts by mass per 100 parts by mass of the total curable composition. If the amount of additives is too large, then there is a possibility that the etching performance of the fine pattern obtained using the curable composition of the present invention may deteriorate.

Further, if required, a solvent or the like may be added to the curable composition of the present invention to improve the coating properties. As this diluent solvent, the solvent used during the reaction for the production of the silsesquioxane skeleton-containing compound may be used again, or this reaction solvent may be removed by distillation under reduced pressure, and dilution then performed using a different solvent.

Examples of this solvent include ketone-based solvents such as methyl isobutyl ketone; aromatic hydrocarbon solvents such as toluene and xylene; ester-based solvents such as ethyl acetate, butyl acetate and propylene glycol monomethyl ether acetate; and alcohol-based solvents such as 2-propanol, butanol, hexanol propylene glycol mono-n-propyl ether and ethylene glycol monoethyl ether.

In the following, one example of the method for producing a magnetic recording medium according to the present invention is specifically described with reference to the drawings. It should be noted that the production method of the present invention is not limited to the production process described below.

(1) A soft magnetic backing layer 2, an orientation control layer 3, a continuous recording layer 4, and where necessary a protective film 5 are formed sequentially on a circular disc-shaped non-magnetic substrate 1, thus forming a recording layer 6 (see FIG. 1(A)). FIG. 1(A) is an enlarged view that illustrates only one portion of the magnetic recording region on the surface of the circular disc-shaped non-magnetic substrate 1.

(2) A resist 7 is applied to the surface of the recording layer 6 formed in step (1) above, thus yielding a medium 8. If necessary, baking may be performed to remove any excess organic solvent or the like (see FIG. 1(B)).

(3) A metal mold (stamper) 9 in which concave-convex portions 9a that have been designed to match the desired track spacing and bit spacing distances have been formed on the surface thereof is brought into close contact with the surface of the medium 8 obtained in step (2) above, and a pressing is then performed under high pressure, thereby forming track-shaped or bit-shaped concave-convex portions 10 on the surface of the medium 8 (hereafter described as an "imprint process") (see FIG. 1(C)). The stamper 9 has a circular disc shape that matches the circular disc-shaped non-magnetic substrate 1, although FIG. 1(C) is an enlarged view that illustrates only one portion of the concave-convex portions 9a of the stamper 9.

(4) Using a technique such as dry etching or reactive ion etching or the like, portions of the resist 7, the protective film 5, the continuous recording layer 4, the orientation control layer 3 and the soft magnetic backing layer 2 formed on the surface of the medium obtained in step (3) above are etched and removed.

As a result of this process, concave-convex portions 11 formed from portions of the magnetic recording layer are left in a pattern that matches the track concave-convex pattern formed in step (3) above (hereafter described as an "etching process").

The concave-convex portions 11 obtained above form a structure in which convex portions 11a that constitute the track portions or bit portions onto which magnetic recording is to be performed and concave grooves 11b that are positioned between these convex portions 11a are formed alternately across the diameter direction (see FIG. 1(D)).

(5) The organosilicon compound having an active energy beam-curable functional group according to the present invention is deposited on top of the above structures, thereby forming a deposition layer 12 that fills the concave grooves 11b formed between the convex portions 11a formed in an alternating pattern across the diameter direction of the non-magnetic substrate 1 (hereafter referred to as "the embedding process").

At this time, it is necessary for the compound to completely fill the concave grooves 11b on the magnetic recording medium, right down to the bottom of the grooves (see FIG. 1(E)).

(6) Subsequently, a dry etching technique such as ion etching is used to smooth the residual concave-convex portions on the surface of the magnetic recording medium, thereby formed a smooth surface 13 on the magnetic recording medium (hereafter referred to as "the smoothing process"). As a result of this process, magnetic recording pattern dividing portions 14 formed of a non-magnetic material are formed inside each of the concave grooves 11b, and each of the recording track portions or bit portions 15 are formed in a region that is compartmentalized by these magnetic recording pattern dividing portions 14 (see FIG. 1(F)).

(7) Finally, a film deposition method such as plasma CVD is used again to deposit a film of DLC (Diamond Like Carbon) as a protective film 16 (see FIG. 1(G)). Further, if required, a lubricant layer 17 may be formed on top of the protective film 16.

By conducting the steps described above, a magnetic recording medium A of the structure illustrated in FIG. 1(H) can be obtained.

The magnetic recording medium A obtained in this manner contains the recording layer 6 formed by sequentially forming the soft magnetic backing layer 2, the orientation control layer 3, the continuous recording layer 4 and the protective film 5 on the surface of the disc-shaped non-magnetic substrate 1, wherein the recording layer 6 is partitioned by the plurality of concave grooves 11b so as to form concentric annular recording track portions or bit portions 15 of a predetermined width, each of these concave grooves 11b is filled with the organosilicon compound having an active energy beam-curable functional group, thereby forming the magnetic recording pattern dividing portions 14, and the protective film 16 and the lubricant layer 17 are then formed so as to cover both the magnetic recording pattern dividing portions 14 and the recording track portions 15.

Any non-magnetic material may be used as the non-magnetic substrate 1 in the steps described above, and specific examples include substrates formed from Al alloy substrates mainly containing Al such as Al—Mg alloy, crystallized glass, amorphous glass, silicon, titanium, ceramics, carbon, and various resins. An example of a crystallized glass substrate is a lithium-based crystallized substrate, whereas examples of amorphous substrates include soda-lime glass and aluminosilicate glass.

The average surface roughness Ra of the non-magnetic substrate 1 is preferably not more than 1 nm, and more preferably 0.5 nm or less, as such a value improves the perpendicular orientation properties of the subsequently formed continuous recording layer 4, and yields a narrower pressure distribution during the imprint step, resulting in improved processing uniformity.

The fine waviness Wa on the surface of the non-magnetic substrate 1 is preferably not more than 0.3 nm, as such a value yields a narrower pressure distribution during the imprint step, resulting in improved processing uniformity.

The soft magnetic backing layer 2 is composed of a soft magnetic material such as materials containing Fe, Co and/or Ni. Specific examples of these materials include FeCo alloys (such as FeCoB, FeCoSiB, FeCoZr and FeCoZrB), FeTa alloys (such as FeTaN and FeTaC) and Co alloys (such as CoTaZr, CoZrNb and CoB).

The soft magnetic backing layer 2 preferably has a layered structure. In other words, by providing Ru, Re or Cu of a predetermined thickness between soft magnetic films, the upper and lower soft magnetic films can be coupled by antiferromagnetic coupling. By employing this type of structure, the phenomenon of WATE (Wide Area Track Erasure), which is an inherent problem with perpendicular magnetic recording media, can be substantially improved.

The orientation control layer 3 has the function of controlling the crystal orientation and crystal size of the continuous recording layer 4 formed on top of the orientation control layer 3. The material used for this layer preferably has an hcp structure or fcc structure. Ru is particularly desirable.

The thickness of the orientation control layer 3 is preferably not more than 30 nm. If the thickness of the orientation control layer 3 exceeds 30 nm, then the distance between the magnetic head and the soft magnetic backing layer 2 during recording and reproduction becomes overly large, causing an undesirable deterioration in both the OW properties (overwrite properties) and the reproduction signal resolution.

The continuous recording layer 4 is preferably a layer in which the easy axis of magnetization is perpendicular to the substrate surface. Conventional materials may be used as the magnetic alloy for this layer, although in the present invention, the use of a magnetic alloy having a granular structure is preferred.

In the present invention, the recording layer is preferably formed from a magnetic material having a granular structure containing at least Co, Pt and an oxide, and in terms of improving the SNR characteristics, elements such as Cr, B, Cu, Ta and Zr are preferably added to this material.

Examples of the oxide used in those cases where the continuous recording layer 4 is formed as a magnetic layer with a granular structure include $SiO_2$, SiO, $Cr_2O_3$, CoO, $Ta_2O_3$ and $TiO_2$. The volumetric ratio of these oxides is preferably within a range from 15 to 40% by volume. If the volumetric ratio of the oxide is less than 15% by volume, then the SNR properties are unsatisfactory and therefore it is not preferable. In contrast, if the volumetric ratio of the oxide exceeds 40% by volume, then the level of coercive force required for a high recording density can not be obtainable and therefore it is not preferable.

The nucleation magnetic field (-Hn) of the recording layer 4 is preferably at least 1.5 (kOe). If -Hn is less than 1.5 (kOe), then heat fluctuations occur and therefore it is not preferable.

The thickness of the recording layer 4 is preferably within a range from 6 to 18 nm. Provided the thickness of the oxide granular layer 4 satisfies this range, a satisfactory output can be ensured and no deterioration occurs in the OW properties, and therefore it is preferable.

The stamper 9 used in the above imprint process is prepared by using an electron beam patterning method or the like to form a very fine track pattern within a metal plate, and therefore the material for that must have sufficient strength and durability to withstand the imprint process. Ni or the like are used, although any material capable of meeting the above requirements may be used.

The resist 7 that is applied onto the magnetic recording medium may use any of the types of photoresists that are widely used industrially. Usually, the resist is applied as a uniform thin film using spin coating or the like, and is then baked in an oven at a constant temperature for a predetermined treatment time to remove unnecessary organic solvents and the like. This process may be altered appropriately depending on the properties of the resist 7 being used.

In the above etching process, methods such as reactive ion etching or ion milling may be used as appropriate. Following complete cutting of the continuous recording layer 4 and formation of the concave grooves (those portions that act as the origins for the magnetic recording pattern dividing portions), the remaining resist left on top of the recording track portions 15 is removed.

In the above embedding process, the organosilicon compound having an active energy beam-curable functional group is used as the embedding material that forms the magnetic recording pattern dividing portions 14. The reasons for using the organosilicon compound having an active energy beam-curable functional group as the embedding material for forming the magnetic recording pattern dividing portions 14 are as described above, although a detailed summary is also provided below.

(1) This material exhibits low levels of surface tension and viscosity, and also exhibits superior wetting properties relative to the materials that constitute the magnetic layer and the like of the magnetic recording medium, and therefore the material is able to completely and precisely fill the concave portions in the recording layer, without leaving voids inside the portions. As a result, corrosion of the magnetic recording medium becomes unlikely.

(2) This material exhibits a very low shrinkage ratio upon curing, and therefore imparts minimal distortion to the ultra fine structure of the recording layer. As a result, corrosion of the magnetic recording medium becomes unlikely.

(3) This material has a skeleton for which the structure is highly controlled, and therefore yields a smooth surface upon solidification, and also exhibits excellent etching properties relative to dry etching using an ion beam or the like, resulting in a smooth etched surface. As a result, the surface smoothness of the magnetic recording medium can be enhanced, meaning the magnetic recording density can be increased.

(4) This material exhibits superior filling properties relative to fine concave-convex patterns when used as an embedding material for the magnetic recording pattern dividing portions 14, and therefore a magnetic recording pattern with excellent dividing properties can be produced that has a finer pattern and deeper dividing portions than have conventionally been obtainable. As a result, a magnetic recording medium having significantly improved recording density can be provided. In other words, in the present invention, very fine and deep dividing regions having a minimum width of 100 nm or less and a maximum depth of 20 nm or more can be formed as the magnetic recording pattern dividing portions 14.

In the embedding process described above, because the non-magnetic material must uniformly fill the extremely fine and deep concave grooves 11*b*, the selection of which process conditions to employ is very important. In the present invention, the organosilicon compound having an active energy beam-curable functional group is preferably applied by either spin coating or a dipping method. In the present invention, by employing one of these methods, the occurrence of voids within the filled portions can be eliminated, which means corrosion of the magnetic recording medium, which is caused when the void portions make contact with gases such as oxygen in the atmosphere, can be prevented.

In the above smoothing process, any concave-convex portion on the medium surface generated following the embedding process is processed to achieve a level of smoothness that is satisfactory for a magnetic recording medium. This smoothing process may employ techniques such as CMP (Chemical Mechanical Polishing) or IBE (Ion Beam Etching). Provided the medium surface can be satisfactorily smoothed without impairing the performance of the medium, any technique may be used without hindering the effects of the present invention, although in the present invention, the use of ion beam etching, which is a dry process, is preferred in terms of reducing contamination of the etched surface. In the present invention, minimizing the floating height of the magnetic head is very effective in achieving high-density magnetic recording. Accordingly, the surface roughness (Ra) of the magnetic recording medium of the present invention is typically not more than 1 nm, preferably not more than 0.5 nm, and more preferably 0.3 nm or less.

Finally, the protective film 16 is formed. Typically, a thin film of DLC (Diamond Like Carbon) is deposited using a technique such as P-CVD, although the method employed is not limited to this technique. The protective film may be generally thought of as a protective film for the magnetic recording medium. Other examples of materials for the protective film include those materials typically used as protective film materials, including carbon material layers formed from C, C hydride, C nitride, amorphous C and SiC, as well as $SiO_2$, $Zr_2O_3$ and TiN. Further, the protective film 16 may also be composed of two or more layers. The thickness of the protective film is typically within a range from 1 to 10 nm, and preferably from 1 to 5 nm. The protective film is preferably formed with the minimum thickness required to ensure favorable durability.

The lubricant layer 17 is formed on top of the protective film 16. Examples of the lubricant used in the lubricant layer 17 include fluorine-based lubricants, hydrocarbon-based lubricants and mixtures thereof. The lubricant layer is typically formed with a thickness of 1 to 4 nm.

A magnetic recording/reproducing apparatus of the present invention includes at least a magnetic recording medium A of the structure described above, a drive unit that drives the magnetic recording medium in the recording direction, a magnetic head composed of a recording unit and a reproduction unit, a device that moves the magnetic head relative to the magnetic recording medium, and a recording/reproducing signal processing device for performing signal input to the magnetic head and reproducing signal output from the magnetic head.

By forming the reproduction unit of the magnetic head as a GMR head or TMR head, adequate signal strength can be obtained even in the case of a high recording density, meaning a high-recording density magnetic recording apparatus can be obtained. Furthermore, if the floating height of the magnetic head is set within a range from 0.005 µm to 0.020 µm, which is lower than conventional floating heights, then the output can be improved, a higher apparatus S/N is obtained, and a high-capacity, high-reliability magnetic recording apparatus can be provided. Furthermore, if a signal processing circuit that employs maximum likelihood decoding is incorporated within the apparatus, then the recording density can be further improved, and for example, satisfactory S/N can be achieved for the recording and reproduction of a track density of 100 kTPI or higher, a linear recording density of 1,000 kbpI or higher, and a recording density per square inch of 100 Gbit/inch or higher.

Figure 2:
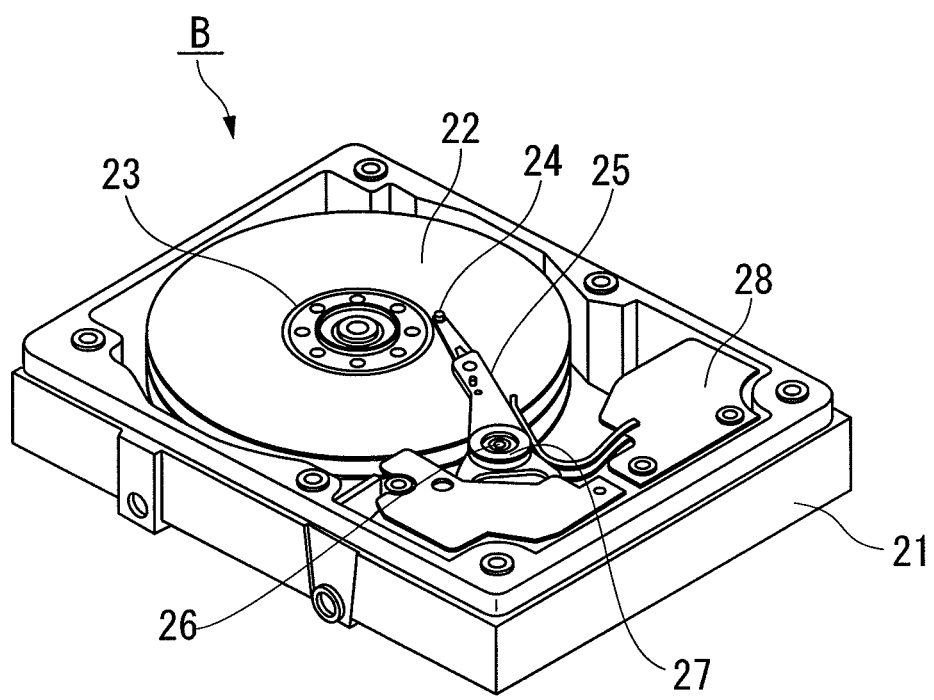
FIG. 2 is a structural diagram illustrating one example of a magnetic recording/reproducing apparatus according to the present invention.

More specifically, a magnetic recording/reproducing apparatus such as that illustrated in FIG. 2 can be constructed. The magnetic recording/reproducing apparatus B of this example illustrated in FIG. 2 includes a rectangular box-shaped casing 21 that is open on top, and a top cover (not shown in the drawing) that seals this opening of the casing 21.

Inside the casing 21 is housed a magnetic recording medium 22 of the structure described above, a spindle motor 23 that functions as a drive device for supporting and rotating the magnetic recording medium 22, a magnetic head 24 (single pole head) that records and reproduces magnetic signals to and from the magnetic recording medium 22, a head actuator 25 that has a suspension with the magnetic head 24 mounted on the tip thereof and supports the magnetic head 24 in a manner that enables free movement of the head relative to the magnetic recording medium 22, a rotational axis 26 that supports the head actuator 25 in a manner that enables free rotation, a voice coil motor 27 that rotates and positions the head actuator 25 using the rotational axis 26, and a head amplifier circuit 28.

EXAMPLES (Synthesis of Silsesquioxane Skeleton-Containing Compound Using a Methacryloyl Group Methacryl Group as the Active Energy Beam-Curable Functional Group)

A three-neck flask equipped with a thermometer and a cooling tube was charged with 1.0 g (0.98 mmol) of octakis (dimethylsilyloxy)silsesquioxane (product name: PSS-Octakis(dimethylsilyloxy) substituted, manufactured by Sigma-Aldrich Co., Ltd.), 1.98 g (15.7 mmol, 2.0 times the number of Si—H groups) of allyl methacrylate and 30 ml of toluene, and the resulting mixture was stirred at room temperature under a stream of Ar. Subsequently, 0.093 g of a 2% xylene solution of a divinyltetramethyldisiloxane-platinum complex (manufactured by GELEST Inc., equivalent to a weight of platinum metal of 1,000 ppm relative to the raw materials) was added gradually to the mixture. Following stirring for 2 hours at room temperature, the toluene solvent was removed by distillation under reduced pressure (percentage of skeleton of the above formula (1) within an entire curable resin composition: 20.6%), and the resulting product was dissolved in propylene glycol monomethyl ether acetate to obtain a solid fraction concentration of 10%.

The photoradical polymerization initiator 2-hydroxy-2-methyl-1-phenylpropan-1-one (DAROCURE 1173, manufactured by Ciba Specialty Chemicals Inc.) was dissolved in the solution obtained above, in an amount of 3 parts of the polymerization initiator per 100 parts of the solution solid fraction, and the resulting solution was then filtered through a 0.2 µm filter, yielding a silsesquioxane skeleton-containing curable composition that contained methacryl groups as the active energy beam-curable functional groups. The weight average molecular weight of the product was approximately 3,000.

Examples 1 to 3, Comparative Examples 1 to 5

A vacuum chamber with a cleaned HD glass substrate (manufactured by Ohara Inc., outer diameter 0.85 inches) mounted inside was evacuated down to a pressure of not more than $1.0 \times 10^{-5}$ Pa. On top of this substrate were deposited, without heating, a thickness of 50 nm of $_{65}$Fe—$_{25}$Co—$_{10}$B (atomic %), 0.8 nm of Ru, and 50 nm of $_{65}$Fe—$_{25}$Co—$_{10}$B (atomic %), thereby forming a soft magnetic backing layer.

Subsequently, an orientation control layer of thickness 20 nm composed of Ru, a recording layer of thickness 12 nm composed of $_{65}$Co—$_{10}$Cr—$_{15}$Pt—$_{10}$SiO$_2$ (atomic %), and a protective film of thickness 4 nm composed of carbon were formed sequentially.

The medium having the layers up to an including the protective film was then removed from the vacuum chamber, and a resist was applied to the medium surface by spin coating. Following application, the medium was baked in a thermostatic chamber at approximately 100° C. for 20 minutes to remove the excess solvent.

Subsequently, using a previously prepared Ni stamper, imprinting was performed to prepare a plurality of samples. The stamper had concentric annular concave grooves with a track pitch of 150 nm formed therebetween.

The prepared samples were mounted inside a high vacuum chamber, and ion beam etching was used to remove the recording film including the recording layer from those portions corresponding with each of the concentric annular concave grooves (namely, the annular grooves corresponding with the magnetic recording pattern dividing portions).

Subsequently, the silsesquioxane skeleton-containing compound described above (examples 1 to 3), SiO$_2$ (comparative example 1), carbon (comparative example 2), nickel (comparative example 3) or a SiO$_2$-based spin-on glass (comparative example 4) was deposited on the surface of each sample to form an average film thickness of 80 nm. In comparative example 5, no deposition was performed within the concave grooves. The viscosity of the silsesquioxane skeleton-containing compound used in examples 1 to 3 was 1,171 mPa·s.

The deposition of these films was performed by spin coating in examples 1 to 3 and comparative example 4, and by sputtering in comparative examples 1 to 3. Spin coating was performed by dripping 0.5 ml of the composition onto the substrate mounted on the spin coater, and then rotating the substrate at 500 rpm for 5 seconds, 3,000 rpm for 2 seconds, and then 5,000 rpm for a further 20 seconds.

Ion beam etching was then used to expose the recording layer within each track portion, and surface smoothing was performed by etching approximately 1 nm of the recording layer surface. Finally, a DLC film of thickness 4 nm was formed using a CVD method, and a 2 nm layer of a lubricant was applied, thereby completing fabrication of the magnetic recording medium.

Example 4

An organosilicon compound having an active energy beam-curable functional group for deposition onto the recording film surface of a magnetic recording medium was synthesized using the method described below.

A three-neck flask equipped with a thermometer and a cooling tube was charged with 2.0 g (8.3 mmol) of 1,3,5,7-tetramethylcyclotetrasiloxane, 6.4 g (34.9 mmol, 1.05 times the number of Si—H groups) of allyl 3,4-epoxycyclohexanecarboxylate and 50 g of toluene, and the resulting mixture was stirred at room temperature under a stream of Ar. Subsequently, 0.82 g of a 2% xylene solution of a divinyltetramethyldisiloxane-platinum complex (equivalent to a weight of platinum metal of 1,000 ppm relative to the raw materials) was added gradually to the mixture in 4 separate portions. Following stirring for 2 hours at room temperature, the toluene solvent was removed by distillation under reduced pressure, and the resulting product was dissolved in propylene glycol monomethyl acetate to obtain a solid fraction concentration of 5%.

The photocationic polymerization initiator triphenylsulfonium hexafluoroantimonate was dissolved in the solution obtained above, in an amount of 2 parts by mass of the polymerization initiator per 100 parts by mass of the solution solid fraction, and the resulting solution was then filtered through a 0.2 μm filter. The viscosity of the thus obtained compound was 1,300 mPa·s.

The synthesized compound was deposited on the recording film surface to produce a magnetic recording medium using the same method as that described for example 1.

(Evaluation of Glide Hit)

The magnetic recording media produced in examples 1 to 4 and comparative examples 1 to 5 were subjected to a glide inspection.

The mechanical spacing between the inspection head and the surface of the magnetic recording medium was set to 8 nm, and the number of signals from the inspection head caused by the head colliding with convex portions on the surface of the magnetic recording medium was counted.

(Evaluation of Corrosion Resistance)

An evaluation of the environment resistance was conducted for each of the magnetic recording media produced in examples 1 to 4 and comparative examples 1 to 5. The evaluation was conducted by holding the magnetic recording medium for 96 hours within an atmosphere at a temperature of 80° C. and a humidity of 85%, and then counting the number of corrosion spots having a size of 5 micronφ or greater generated on the surface of the magnetic recording medium.

(Evaluation Results)

The results for the glide hit evaluations and corrosion resistance evaluations performed on the magnetic recording media of examples 1 to 4 and comparative examples 1 to 5 are shown below in Table 1.

As is evident from Table 1, examples 1 to 4, which represent magnetic recording media produced using the production method of the present invention, had a high degree of surface smoothness and superior environment resistance.

TABLE 1

|  | Embedding material | Concentration | Molecular weight | Glide hit count (8 nm floating height) | Corrosion spots (number/surface) |
|---|---|---|---|---|---|
| Example 1 | Silsesquioxane skeleton-containing compound | 4% | 3000 | 3 | 0 |
| Example 2 | Silsesquioxane skeleton-containing compound | 3% | 3000 | 3 | 2 |
| Example 3 | Silsesquioxane skeleton-containing compound | 8% | 3000 | 6 | 3 |
| Example 4 | Organosilicon compound | 4% | 3000 | 4 | 4 |
| Comparative example 1 | $SiO_2$ | — | — | At least 100 | 0 |
| Comparative example 2 | Carbon | — | — | 5 | 3 |
| Comparative example 3 | Ni | — | — | Head crash | 7 |
| Comparative example 4 | Spin-on glass | — | — | At least 100 | 3 |
| Comparative example 5 | None | — | — | Head crash | 53 |

The invention claimed is:

1. A method for producing a magnetic recording medium comprising at least a recording layer and a protective film provided on top of a non-magnetic substrate, said method comprising, in the following order:
   forming a continuous recording layer on said substrate,
   forming a patterned resist layer,
   partially removing said recording layer based on a resist pattern,
   applying a coating consisting of an organosilicon compound having a single skeleton with an active energy beam-curable functional group onto said recording layer and regions from which said recording layer has been removed,
   curing said organosilicon compound with an active energy beam,
   etching said organosilicon compound to expose a magnetic layer, and
   forming a protective film.

2. The method for producing a magnetic recording medium according to claim 1, wherein said active energy beam-curable functional group is one or more groups selected from the group consisting of an epoxy group, oxetanyl group, and (meth)acryloyl group.

3. The method for producing a magnetic recording medium according claim 1, wherein said organosilicon compound having an active energy beam-curable functional group is any one selected from group consisting of compounds represented by chemical formula 1 shown below:

[Chemical formula 1]

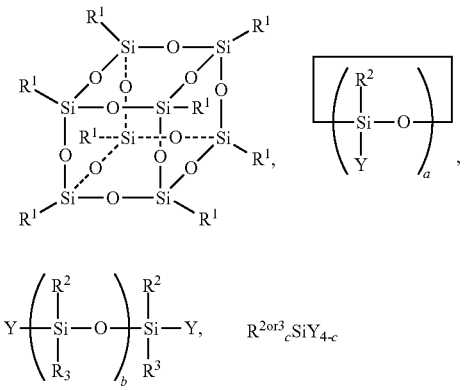

wherein $R^1$ represents Y or $YR^2R^3SiO—$, $R^2$ and $R^3$ each represents an aliphatic group of 1 to 10 carbon atoms or an aromatic hydrocarbon group, a represents 4 or 5, b represents 1 or 2, c represents an integer of 1 to 3, and Y is shown below in chemical formula 2:

[Chemical formula 2]

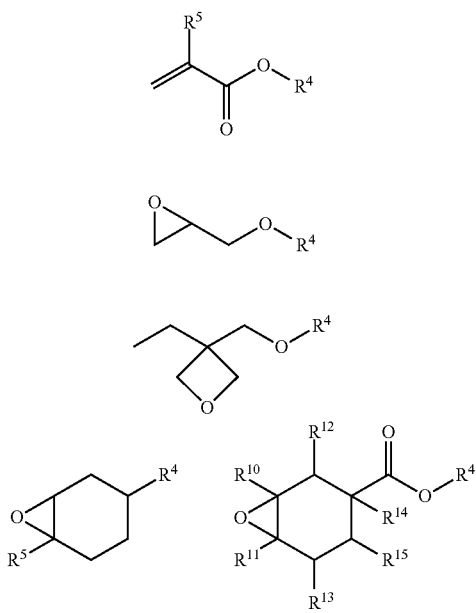

wherein $R^4$ represents one structure shown below in chemical formula 3, $R^5$ represents a hydrogen atom or a methyl group, each of $R^{10}$ to $R^{14}$ represents a hydrogen atom, an alkyl group of 1 to 6 carbon atoms, or a trialkylsilyl group of 1 to 4 carbon atoms, and $R^{15}$ represents a hydrogen atom, an alkyl group of 1 to 6 carbon atoms, a trialkylsilyl group of 1 to 4 carbon atoms, or an aryl group,

[Chemical formula 3]

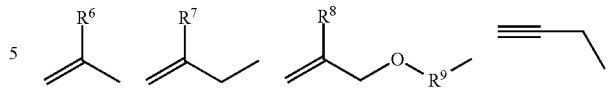

wherein each of $R^6$ to $R^8$ represents a hydrogen atom or a methyl group, and $R^9$ represents an alkylene group of 2 to 8 carbon atoms.

4. The method for producing a magnetic recording medium according to claim 1, wherein a viscosity of said organosilicon compound during application is within a range from 10 mPa·s to 1,000,000 mPa·s at 25° C., and
a concave-convex pattern formed on a surface to which said organosilicon compound is applied comprises concave portion having a minimum width of 100 nm or less and a maximum depth of 20 nm or more.

5. The method for producing a magnetic recording medium according to claim 1, wherein said organosilicon compound is a silsesquioxane skeleton-containing compound having a silsesquioxane skeleton represented by formula (1) shown below within a molecule.

[Chemical formula 4]

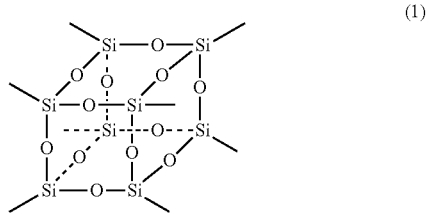

(1)

6. The method for producing a magnetic recording medium according to claim 5, wherein said silsesquioxane skeleton represents at least 5% of a molecular weight of said silsesquioxane skeleton-containing compound.

7. The method for producing a magnetic recording medium according to claim 5, wherein said silsesquioxane skeleton-containing compound is produced by performing a hydrosilylation reaction between a cage-type silsesquioxane (A) having Si—H groups and said silsesquioxane skeleton, and a compound (B) containing said curable functional group and a carbon-carbon unsaturated bond other than said curable functional group.

8. The method for producing a magnetic recording medium according to claim 7, wherein said cage-type silsesquioxane (A) is represented by formula (2) shown below:

[Chemical formula 5]

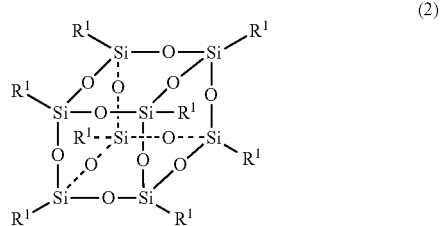

(2)

wherein $R^1$ represents a hydrogen atom or $HR^2R^3SiO$—, and $R^2$ and $R^3$ each represents an aliphatic group of 1 to 10 carbon atoms or an aromatic hydrocarbon group.

9. The method for producing a magnetic recording medium according to claim 7, wherein said compound (B) is at least one selected from the group consisting of a compound (a), a compound (b) and a compound (c) shown below in chemical formula 6:

[Chemical formula 6]

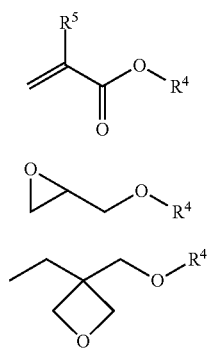

wherein $R^4$ represents one structure shown below in chemical formula 7, and $R^5$ represents a hydrogen atom or a methyl group,

[Chemical formula 7]

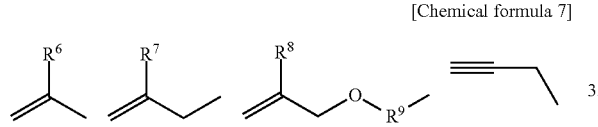

wherein each of $R^6$ to $R^8$ represents a hydrogen atom or a methyl group, and $R^9$ represents an alkylene group of 2 to 8 carbon atoms.

10. The method for producing a magnetic recording medium according to claim 5, wherein said organosilicon compound further comprises a curing agent.

11. The method for producing a magnetic recording medium according to claim 10, wherein said active energy beam-curable functional group is an epoxy group, and said curing agent is an acid anhydride.

12. The method for producing a magnetic recording medium according to claim 10, wherein said organosilicon compound further comprises a polythiol compound, and said active energy beam-curable functional group p is a (meth) acryloyl group.

13. The method for producing a magnetic recording medium according to claim 10, wherein said organosilicon compound further comprises a compound having a vinyl ether group, and said active energy beam-curable functional group is an epoxy group.

14. The method for producing a magnetic recording medium according to claim 1, wherein spin coating or a dipping method is used for applying said organosilicon compound having an active energy beam-curable functional group.

15. The method for producing a magnetic recording medium according to claim 1, wherein etching of said organosilicon compound is performed using an ion beam etching method.

16. The method for producing a magnetic recording medium according to claim 1, wherein said organosilicon compound is synthesized from octakis(dimethylsilyloxy) silsesquioxane or 1,3,5,7-tetramethylcyclotetrasiloxane.

17. The method for producing a magnetic recording medium according to claim 1, wherein said the organosilicon compound is synthesized from octakis(dimethylsilyloxy) silsesquioxane.

18. The method for producing a magnetic recording medium according to claim 1, wherein said organosilicon compound having an active energy beam-curable functional group is any one selected from the group consisting of compounds represented by the chemical formula 8 shown below:

[Chemical formula 8]

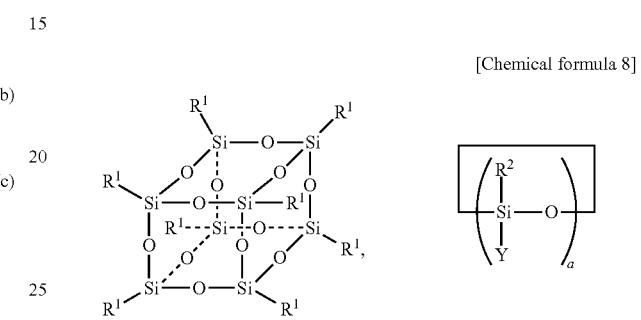

wherein $R^1$ represents Y or $YR^2R^3SiO$—, $R^2$ and $R^3$ each represents an aliphatic group of 1 to 10 carbon atoms or an aromatic hydrocarbon group, a represents 4 or 5, and Y is shown below in chemical formula 9:

[Chemical formula 9]

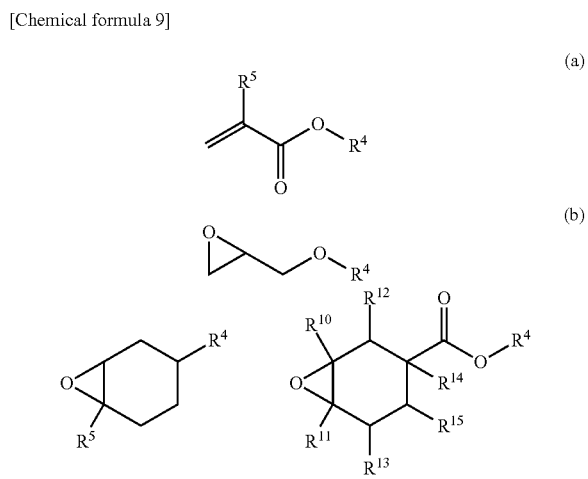

wherein $R^4$ represents one structure shown below in chemical formula 3, $R^5$ represents a hydrogen atom or a methyl group, each of $R^{10}$ to $R^{15}$ represents a hydrogen atom, [Chemical formula 10]

[Chemical formula 10]

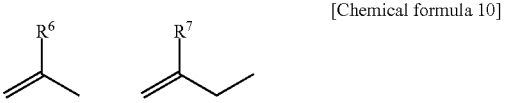

wherein each of $R^6$ and $R^7$ represents a hydrogen.

* * * * *